US008664036B2

(12) United States Patent
Yamazaki et al.

(10) Patent No.: US 8,664,036 B2
(45) Date of Patent: Mar. 4, 2014

(54) SEMICONDUCTOR DEVICE AND MANUFACTURING METHOD THEREOF

(75) Inventors: Shunpei Yamazaki, Tokyo (JP); Hotaka Maruyama, Tochigi (JP); Yoshiaki Oikawa, Kanagawa (JP); Katsuaki Tochibayashi, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 681 days.

(21) Appl. No.: 12/968,331

(22) Filed: Dec. 15, 2010

(65) Prior Publication Data

US 2011/0151618 A1 Jun. 23, 2011

(30) Foreign Application Priority Data

Dec. 18, 2009 (JP) ................................. 2009-288245

(51) Int. Cl.
*H01L 21/00* (2006.01)

(52) U.S. Cl.
USPC 438/104; 438/158; 257/E21.46; 257/E29.23; 257/E29.296

(58) Field of Classification Search
USPC ............. 438/104, 158; 257/E21.46, E29.117, 257/E29.276, E29.296
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Michael Lebentritt
*Assistant Examiner* — Aaron Dehne
(74) *Attorney, Agent, or Firm* — Eric J. Robinson; Robinson Intellectual Property Law Office, P.C.

(57) ABSTRACT

An oxide semiconductor layer with excellent crystallinity is formed to enable manufacture of transistors with excellent electrical characteristics for practical application of a large display device, a high-performance semiconductor device, etc. By first heat treatment, a first oxide semiconductor layer is crystallized. A second oxide semiconductor layer is formed over the first oxide semiconductor layer. By second heat treatment, an oxide semiconductor layer including a crystal region having the c-axis oriented substantially perpendicular to a surface is efficiently formed and oxygen vacancies are efficiently filled. An oxide insulating layer is formed over and in contact with the oxide semiconductor layer. By third heat treatment, oxygen is supplied again to the oxide semiconductor layer. A nitride insulating layer containing hydrogen is formed over the oxide insulating layer. By fourth heat treatment, hydrogen is supplied at least to an interface between the second oxide semiconductor layer and the oxide insulating layer.

22 Claims, 13 Drawing Sheets

(56) References Cited

U.S. PATENT DOCUMENTS

| | | |
|---|---|---|
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,074 B2 | 9/2010 | Iwasaki |
| 7,994,500 B2 | 8/2011 | Kim et al. |
| 8,148,779 B2 | 4/2012 | Jeong et al. |
| 8,188,480 B2 | 5/2012 | Itai |
| 8,203,143 B2 | 6/2012 | Imai |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0105288 A1 | 5/2007 | Miyairi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287221 A1 | 12/2007 | Ong et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0246064 A1 | 10/2008 | Kimura |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0261444 A1 | 10/2009 | Yamazaki et al. |
| 2009/0278122 A1 | 11/2009 | Hosono et al. |
| 2009/0280600 A1 | 11/2009 | Hosono et al. |
| 2009/0310734 A1 | 12/2009 | Umezaki |
| 2010/0051938 A1 | 3/2010 | Hayashi et al. |
| 2010/0065844 A1 | 3/2010 | Tokunaga |
| 2010/0084648 A1 | 4/2010 | Watanabe |
| 2010/0092800 A1 | 4/2010 | Itagaki et al. |
| 2010/0109002 A1 | 5/2010 | Itagaki et al. |
| 2010/0117078 A1* | 5/2010 | Kuwabara et al. ............. 257/43 |
| 2010/0123130 A1 | 5/2010 | Akimoto et al. |
| 2010/0163874 A1 | 7/2010 | Koyama et al. |
| 2010/0193782 A1 | 8/2010 | Sakata |
| 2010/0276689 A1 | 11/2010 | Iwasaki |
| 2010/0279462 A1 | 11/2010 | Iwasaki |
| 2010/0320458 A1 | 12/2010 | Umeda et al. |
| 2011/0057185 A1* | 3/2011 | Peng et al. ..................... 257/43 |
| 2011/0133180 A1* | 6/2011 | Yamazaki ...................... 257/43 |
| 2011/0193083 A1 | 8/2011 | Kim et al. |
| 2012/0012840 A1* | 1/2012 | Korthuis et al. ............... 257/43 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-026119 | 1/2000 |
| JP | 2000-044236 A | 2/2000 |
| JP | 2000-150900 A | 5/2000 |
| JP | 2001-053164 | 2/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-298062 A | 10/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2009-099847 A | 5/2009 |
| JP | 2009-231613 | 10/2009 |
| JP | 2010-016347 | 1/2010 |
| JP | 2010-067954 | 3/2010 |
| WO | WO-2004/114391 | 12/2004 |
| WO | WO-2007/029844 | 3/2007 |
| WO | WO-2008/126879 | 10/2008 |

OTHER PUBLICATIONS

Dembo.H et al., "RFCPUS on Glass and Plastic Substrates Fabricated by TFT Transfer Technology,", IEDM 05: Technical Digest on

(56) References Cited

OTHER PUBLICATIONS

International Electron Devices Meeting, Dec. 5, 2005, pp. 1067-1069.
Ikeda.T et al., "Full-Functional System Liquid Crystal Display Using CG-Silicon Technology,", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors,", Nature, Nov. 25, 2004, vol. 432, pp. 488-492.
Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.
Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.
Hayashi.R et al., "42.1: Invited Paper: Improved Amorphous In-Ga-Zn-O TFTs,", SID Digest '08 : SID International Symposium Digest of Technical Papers, May 20, 2008, vol. 39, pp. 621-624.
Prins.M et al., "A Ferroelectric Transparent Thin-Film Transistor,", Appl. Phys. Lett. (Applied Physics Letters) , Jun. 17, 1996, vol. 68, No. 25, pp. 3650-3652.
Nakamura.M et al., "The phase relations in the $In_2O_3$-$Ga_2ZnO_4$-ZnO system at 1350°C.,", Journal of Solid State Chemistry, Aug. 1, 1991, vol. 93, No. 2, pp. 298-315.
Kimizuka.N. et al., "Syntheses and Single-Crystal Data of Homologous Compounds, $In_2O_3(ZnO)m$ (m = 3, 4, and 5), $InGaO_3(ZnO)_3$, and $Ga_2O_3(ZnO)m$ (m =7,8,9, and 16) in the $In_2O_3$-$ZnGa_2O_4$-ZnO System,", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.
Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.
Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline $InGaO_3(ZnO)_5$ films,", Appl. Phys. Lett. (Applied Physics Letters) , Sep. 13, 2004, vol. 85, No. 11, pp. 1993-1995.
Li.C et al., "Modulated Structures of Homologous Compounds $InMO_3(ZnO)m$ (M=In,Ga; m=Integer) Described by Four Dimensional Superspace Group,", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO ($Ga_2O_3$-$In_2O_3$-ZnO) TFT,", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing $MOO_3$ as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.
Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid-State Circuits , 2008, vol. 43, No. 1, pp. 292-299.
Ohara.H et al., "Amorphous In-Ga-Zn-Oxide TFTs with Suppressed Variation for 4.0 inch QVGA AMOLED Display,", AM-FDP '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane,", SID Digest '09: SID International Symposium Digest of Technical Papers, May 31, 2009, pp. 280-283.
Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.
Sakata.J et al., "Development of 4.0-In. AMOLED Display With Driver Circuit Using Amorphous In-Ga-Zn-Oxide TFTs,", IDW '09 : Proceedings of the 16th International Display Workshops, 2009, pp. 689-692.
Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.
Park.S et al., "Challenge to Future Displays: Transparent AM-OLED Driven by Peald Grown ZnO TFT,", IMID '07 Digest, 2007, pp. 1249-1252.
Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.
Osada.T et al., "Development of Driver-Integrated Panel Using Amorphous In-Ga-Zn-Oxide TFT,", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.
Ohara.H et al., "21.3:4.0 In. QVGA AMOLED Display Using In-Ga-Zn-Oxide TFTs With a Novel Passivation Layer,", SID Digest '09 : SID International Symposium Digest of Technical Papers, May 31, 2009, pp. 284-287.

(56) References Cited

OTHER PUBLICATIONS

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID-Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 1, 2002, vol. 1, pp. 64-68.

Kimizuka.n. et al., "Spinel,YBFE2O4, and YB2FE3O7 Types of Structures for Compounds in the IN2O3 and SC2O3-A2O3-BO Systems [A; Fe, Ga, or Al; B: Mg, Fe, Ni, Cu, or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B. (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS.Meeting, 2008, No. 2317.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum.Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

International Search Report (Application No. PCT/JP2010/071422) Dated Jan. 11, 2011.

Written Opinion (Application No. PCT/JP2010/071422) Dated Jan. 11, 2011.

Nakayama et al., "17a-TL-8 Effect of GaO Layer on IGZO-TFT Channel," Extended Abstracts (The 57th Spring Meeting 2010), The Japan Society of Applied Physics and Related Societies, Mar. 17, 2010, pp. 21-008.

* cited by examiner

SEMICONDUCTOR DEVICE AND MANUFACTURING METHOD THEREOF

TECHNICAL FIELD

The present invention relates to a semiconductor device having a circuit including at least a semiconductor element such as a transistor as one element, and a manufacturing method thereof. For example, the present invention relates to a power device which is mounted on a power supply circuit; a semiconductor integrated circuit including a memory, a thyristor, a converter, an image sensor, or the like; and an electronic device on which an electro-optical device typified by a liquid crystal display panel or a light-emitting display device including an organic light-emitting element is mounted as a component.

Note that the semiconductor device in this specification refers to all the devices which can operate by using semiconductor characteristics, and an electro-optical device, a semiconductor circuit, and an electronic device are all semiconductor devices.

BACKGROUND ART

As typically seen in a liquid crystal display device, a transistor formed over a glass substrate or the like is formed using amorphous silicon, polycrystalline silicon, or the like. Although transistors including amorphous silicon have low field-effect mobility, they can be formed over a larger glass substrate. In contrast, transistors including polycrystalline silicon have high field-effect mobility, but they have a disadvantage of not being suitable for a large glass substrate.

In contrast to the transistors manufactured using silicon, attention has been drawn to a technique by which a transistor is manufactured using an oxide semiconductor and is applied to an electronic device or an optical device. For example, Patent Document 1 and Patent Document 2 disclose a technique by which a transistor is manufactured using zinc oxide or In—Ga—Zn—O-based oxide as an oxide semiconductor and is used as a switching element of pixel or the like of an image display device.

REFERENCE

[Patent Document 1] Japanese Published Patent Application No. 2007-123861
[Patent Document 1] Japanese Published Patent Application No. 2007-96055

DISCLOSURE OF INVENTION

In addition, large display devices have been spread. Televisions having a display screen with a diagonal dimension of 40 inch class to 50 inch class have started to be spread as home-use televisions.

A gate-insulated transistor including an oxide semiconductor has a field-effect mobility of 10 $cm^2/Vs$ to 20 $cm^2/Vs$. Having a field-effect mobility more than or equal to 10 times that of a gate-insulated transistor including amorphous silicon, the gate-insulated transistor including an oxide semiconductor is satisfying as a switching element of a pixel even in a large display device.

However, there has been a limit on the use of a gate-insulated transistor including an oxide semiconductor as a driver element of a semiconductor device, e.g., an element in a driver circuit of a large display device or the like. Elements with higher mobility are therefore needed.

An object of one embodiment of the present invention is to manufacture transistors which include an oxide semiconductor layer with excellent crystallinity and have a high field-effect mobility as well as to increase the substrate in size so that practical application of a large display device, a high-performance semiconductor device, or the like may be realized.

As one method for increasing the field-effect mobility of a transistor, crystallization of an oxide semiconductor layer is employed. After a first oxide semiconductor layer is formed, heat treatment is performed for crystallization. A second oxide semiconductor layer is formed thereover. Then, crystal growth of the second oxide semiconductor layer is caused from the interface between the first oxide semiconductor layer and the second oxide semiconductor layer toward a surface of the second oxide semiconductor layer. A crystal layer in the first oxide semiconductor layer (a first crystal layer) is a seed crystal for the second oxide semiconductor layer. It is important to form the second oxide semiconductor layer as a crystal layer (a second crystal layer) over the first oxide semiconductor layer. This method for forming the first crystal layer and the second crystal layer is effective for all oxide semiconductors having hexagonal crystals. Note that the first crystal layer and the second crystal layer have plate-like crystals (also referred to as co-growing (CG) crystals). They are non-single crystals in which the a-axis and the b-axis of each crystal are oriented parallel to a surface in a channel formation region and in which the c-axis of each crystal is oriented substantially perpendicular to a surface the oxide semiconductor layer.

Further, as another method for increasing the field-effect mobility of a transistor, the oxide semiconductor layer is highly purified and a quality thereof is improved in the same step as or a different step from the crystallization step. Specifically, hydroxyl, moisture, and the like which contain hydrogen serving as a donor in an oxide semiconductor are removed, and oxygen which is the main component of the oxide semiconductor layer is sufficiently supplied to fill oxygen vacancies, whereby the oxide semiconductor layer is highly purified and has an improved quality.

As another method for supplying oxygen to the oxide semiconductor layer, heat treatment on the oxide semiconductor layer in an atmosphere containing oxygen, formation of an oxide insulating layer in contact with the oxide semiconductor layer, or heat treatment after the formation of an oxide insulating layer is employed, for example.

Then, after oxygen is supplied to the oxide semiconductor layer, a nitride insulating layer containing hydrogen atoms is formed as an interlayer film over the oxide semiconductor layer. Hydrogen atoms are diffused from the nitride insulating film into an interface of the oxide semiconductor layer (specifically, an interface with a $SiO_x$ layer) or into the film by heating in order to improve characteristics. By heating, hydrogen atoms diffused from the nitride insulating layer terminate dangling bonds of Si at an interface between the oxide semiconductor layer and the $SiO_x$ layer, dangling bonds of oxygen or the like in the oxide semiconductor, or the like. According to one embodiment of the present invention, an appropriate amount of hydrogen atoms is intentionally added to an oxide semiconductor layer which is c-axis-oriented by crystallization to eliminate a defect level. Note that in this specification, "containing hydrogen atoms" means containing more hydrogen atoms than another insulating layer in contact with an oxide semiconductor layer. For example, the hydrogen concentration of the nitride insulating layer containing hydrogen atoms is preferably $1\times10^{19}$ atoms/$cm^3$ to $1\times10^{22}$ atoms/$cm^3$ inclusive.

One embodiment according to the present invention disclosed in this specification is a method for manufacturing a semiconductor device, including the steps of: forming a first oxide semiconductor layer over a substrate having an insulating surface; performing first heat treatment on a structure including the first oxide semiconductor layer to form a crystal region which is grown from a surface toward an inside of the first oxide semiconductor layer, the crystal region having a c-axis oriented in a direction substantially perpendicular to the surface of the first oxide semiconductor layer; forming a second oxide semiconductor layer over the first oxide semiconductor layer including the crystal region; performing second heat treatment which has conditions including an atmosphere including oxygen and a constant temperature on a structure including the first and second oxide semiconductor layers to grow c-axis oriented crystals in the second oxide semiconductor layer using the crystal region as a seed and to supply oxygen to the first and second oxide semiconductor layers; forming a conductive layer over the second oxide semiconductor layer on which the second heat treatment is performed; forming a source electrode layer and a drain electrode layer by selectively etching the conductive layer; forming an oxide insulating layer to cover the source electrode layer, the drain electrode layer, and the second oxide semiconductor layer; performing third heat treatment on a structure including the oxide insulating layer to supply oxygen to the second oxide semiconductor layer; forming a gate electrode layer over a region of the oxide insulating layer, the region overlapping with the second oxide semiconductor layer to which oxygen is supplied; forming a nitride insulating layer including hydrogen over the gate electrode layer and the oxide insulating layer; and performing fourth heat treatment on a structure including the nitride insulating layer to terminate a dangling bond with hydrogen at least in the first and second oxide semiconductor layers and at an interface between the first and second oxide semiconductor layers and the oxide insulating layer in contact with the first and second oxide semiconductor layers.

Another embodiment according to the present invention disclosed in this specification is a method for manufacturing a semiconductor device, including the steps of: forming a gate electrode layer over a substrate having an insulating surface; forming a first oxide insulating layer to cover the gate electrode layer; forming a first oxide semiconductor layer over the gate electrode layer and the first oxide insulating layer; performing first heat treatment on a structure including the first oxide semiconductor layer to form a crystal region which is grown from a surface toward an inside of the first oxide semiconductor layer, the crystal region having a c-axis oriented in a direction substantially perpendicular to the surface of the first oxide semiconductor layer; forming a second oxide semiconductor layer over the first oxide semiconductor layer including the crystal region; performing second heat treatment which has conditions including an atmosphere including oxygen and a constant temperature on a structure including the first and second oxide semiconductor layers to grow c-axis oriented crystals in the second oxide semiconductor layer using the crystal region as a seed and to supply oxygen to the first and second oxide semiconductor layers; forming a conductive layer over the second oxide semiconductor layer on which the second heat treatment is performed; forming a source electrode layer and a drain electrode layer by selectively etching the conductive layer; forming a second oxide insulating layer to cover the source electrode layer, the drain electrode layer, and the second oxide semiconductor layer; performing third heat treatment on a structure including the second oxide insulating layer to supply oxygen to the second oxide semiconductor layer; forming a nitride insulating layer including hydrogen over the second oxide insulating layer on which the third heat treatment is performed; and performing fourth heat treatment on a structure including the nitride insulating layer to terminate a dangling bond with hydrogen at least in the first and second oxide semiconductor layers and at interfaces between the first oxide insulating layer and the first and second oxide semiconductor layers and between the second oxide insulating layer and the first and second oxide semiconductor layers.

A condition for the second heat treatment includes a constant temperature and an atmosphere containing oxygen, which is one of the important characteristics. For example, crystallization and dehydration or dehydrogenation can be promoted at a high temperature in a nitrogen atmosphere in a first step, and then oxygen can be supplied to the oxide semiconductor to fill oxygen vacancies by heat treatment at a constant temperature in an atmosphere containing oxygen in a second step. Alternatively, a condition for the second heat treatment may only include an atmosphere containing oxygen. Here, "dehydration or dehydrogenation" refers to not only release of $H_2O$ or $H_2$ by heat treatment but also release of H, OH, and the like, for the sake of convenience. Further, a "constant temperature" allows temperature variation which the apparatus cannot control. Further, the apparatus may be controlled so as to moderately vary the temperature, and the temperature in such a case can also be referred to as a "constant temperature."

The gate-insulated transistors which are manufactured by any of the above method can have not only high field-effect mobility and but also less variation in electrical characteristics.

The gate-insulated transistors having high field-effect mobility and less variation in electrical characteristics are manufactured to realize a large display device, a high-performance semiconductor device, and the like.

BEST MODE FOR CARRYING OUT THE INVENTION

Hereinafter, embodiments of the present invention will be described in detail with reference to the accompanying drawings. Note that the present invention is not limited to the following description and it will be readily appreciated by those skilled in the art that modes and details can be modified in various ways. Accordingly, the present invention should not be construed as being limited to the description of the embodiments to be given below.

Embodiment 1

In this embodiment, a structure and a manufacturing method of a semiconductor device according to one embodiment of the present invention will be described with reference to FIG. 1, FIGS. 2A to 2E, FIGS. 3A to 3D, and FIGS. 4A to 4E.

Figure 1:
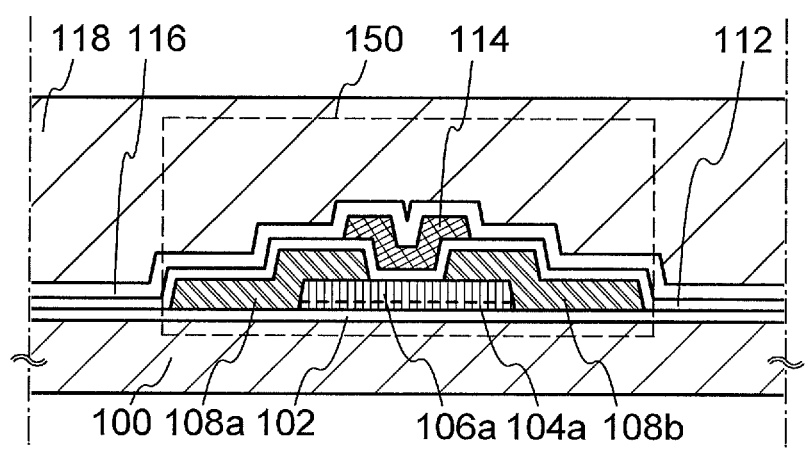
FIG. 1 is a cross-sectional view of one embodiment of the present invention.

FIG. 1 is a cross-sectional view illustrating a top-gate transistor 150 which is an example of a structure of a semiconductor device. Note that although the transistor 150 described here is an n-channel gate-insulated transistor (also referred to as insulated gate field-effect transistor (IGFET)) whose carriers are electrons, the transistor 150 may be a p-channel gate-insulated transistor.

A method for manufacturing the transistor 150 will be described with reference to FIGS. 2A to 2E and FIGS. 3A to 3D.

First, an insulating layer 102 is formed over a substrate 100. Then, a first oxide semiconductor layer is formed over the insulating layer 102, and first heat treatment is performed to crystallize at least a region including a surface of the first oxide semiconductor layer, whereby a first oxide semiconductor layer 104 is formed (see FIG. 2A).

Any substrate which has an insulating surface, such as a glass substrate, can be used as the substrate 100. In particular, a large glass substrate is preferably used because semiconductor devices according to one embodiment of the present invention can be mass-produced at low cost. Further, it is preferable that the glass substrate be a non-alkali glass substrate. As a material of the non-alkali glass substrate, a glass material such as aluminosilicate glass, aluminoborosilicate glass, barium borosilicate glass, or the like is used, for example. Alternatively, as the substrate 100, the following substrates can be used: an insulating substrate formed using an insulator such as a quartz substrate or a sapphire substrate, a semiconductor substrate which is formed using a semiconductor material such as silicon and whose surface is covered with an insulating material, or a conductive substrate which is formed using a conductor such as metal or stainless steel and whose surface is covered with an insulating material.

The insulating layer 102 serves as a base and can be formed by a CVD method, a sputtering method, or the like. The insulating layer 102 is preferably formed using silicon oxide, silicon nitride, silicon oxynitride, silicon nitride oxide, aluminum oxide, hafnium oxide, tantalum oxide, or the like. Note that the insulating layer 102 may have a single-layer structure or a stacked-layer structure. There is no particular limitation on the thickness of the insulating layer 102; the insulating layer 102 can have a thickness of 10 nm to 500 nm inclusive, for example. Note that the insulating layer 102 is not an essential component and may be omitted.

The first oxide semiconductor layer formed over the insulating layer 102 may be formed using an oxide semiconductor material which is a three-component metal oxide and is represented by In-$M_X$-$Zn_Y$-$O_Z$ (Y=0.5 to 5). Here, M represents one or more kinds of elements selected from Group 13 elements such as gallium (Ga), aluminum (Al), and boron (B). Note that any amount of In, M, Zn, and O can be contained, and the M content may be zero (that is, x=0). On the other hand, each of the In content and the Zn content is not zero. In other words, the above expression may represent In—Ga—Zn—O, In—Zn—O, and the like.

The first oxide semiconductor layer can be formed using In—Sn—Ga—Zn—O-based metal oxide which is four-component metal oxide; In—Ga—Zn—O-based metal oxide, In—Sn—Zn—O-based metal oxide, In—Al—Zn—O-based metal oxide, Sn—Ga—Zn—O-based metal oxide, Al—Ga—Zn—O-based metal oxide, or Sn—Al—Zn—O-based metal oxide which are three-component metal oxide; In—Zn—O-based metal oxide, In—Ga—O-based metal oxide, Sn—Zn—O-based metal oxide, Al—Zn—O-based metal oxide, Zn—Mg—O-based metal oxide, Sn—Mg—O-based metal oxide, or In—Mg—O-based metal oxide which are two-component metal oxide; or In—O-based metal oxide, Sn—O-based metal oxide, Zn—O-based metal oxide, or the like.

In this embodiment, the first oxide semiconductor layer is formed by a sputtering method using an In—Ga—Zn—O-based oxide semiconductor target.

The target for forming the first oxide semiconductor layer by a sputtering method is, for example, a metal oxide target containing $In_2O_3$, $Ga_2O_3$, and ZnO in a composition ratio (molar ratio) of 1 to 1 to 1. Alternatively, a metal oxide target may contain $In_2O_3$, $Ga_2O_3$, and ZnO in a composition ratio (molar ratio) of 1 to 1 to 2. In this embodiment, since the formed oxide semiconductor layer is subjected to heat treatment for intentional crystallization in a later step, it is preferable to use an oxide semiconductor target whose composition facilitates generation of crystals.

It is preferable that the relative density of the oxide semiconductor in the oxide semiconductor target is 80% or more, more preferably 95% or more, further preferably 99.9% or more. With the use of an oxide semiconductor target with high relative density, a dense first oxide semiconductor layer can be formed.

A sputtering gas for the formation of the first oxide semiconductor layer is preferably a rare gas (typically argon), oxygen, or a mixed gas of a rare gas (typically argon) and oxygen. In addition, it is preferable to use a high-purity gas in which impurities such as hydrogen, water, hydroxyl, or hydride are reduced to such a degree that the concentration thereof can be expressed by the unit ppm (preferably, ppb).

At the time of the formation of the first oxide semiconductor layer, for example, the substrate is placed in a process chamber which is kept under a reduced pressure and the substrate temperature is set 100° C. to 600° C. inclusive, preferably 200° C. to 400° C. inclusive. While moisture remaining in the process chamber is removed, a sputtering gas from which hydrogen and water are removed is introduced to form the first oxide semiconductor layer using metal oxide as a target. The first oxide semiconductor layer is formed while the substrate is heated, whereby the impurities in the first oxide semiconductor film can be reduced. Moreover, damage of the film due to sputtering is reduced. It is preferable that moisture or the like which remains in the sputtering apparatus is removed before, during, and/or after deposition of the first oxide semiconductor layer. In order to remove moisture remaining in the process chamber, a capture-type vacuum pump is preferably used. For example, a cryopump, an ion pump, or a titanium sublimation pump can be used. A turbo pump provided with a cold trap may be used. Since hydrogen, water, or the like is removed from the process chamber evacuated with those pumps, the impurity concentration of the first oxide semiconductor layer can be reduced.

Note that preheat treatment may be performed before the formation of the first oxide semiconductor layer, in order to remove moisture and the like which remains in the sputtering apparatus. For the preheat treatment, a method in which the inside of the process chamber is heated to 200° C. to 600° C. inclusive under reduced pressure, a method in which introduction and exhaust of nitrogen or an inert gas are repeated while the inside of the process chamber is heated, and the like can be given. After the preheat treatment, the substrate or the sputtering apparatus is cooled. After that, the oxide semiconductor layer is formed without exposure to air. In this case, not water but oil or the like may be used as a coolant for the target. Although a certain level of effect can be obtained when introduction and exhaust of nitrogen are repeated without heating, it is preferable to perform the treatment with the inside of the process chamber heated.

The first oxide semiconductor layer can be formed under the following conditions, for example: the distance between a substrate and a target is 170 mm; the pressure is 0.4 Pa; the direct-current (DC) power is 0.5 kW; and the atmosphere is an oxygen atmosphere (the proportion of the oxygen flow is 100%). Note that a pulse direct current (DC) power supply is preferable because dust (powder or flake-like substances formed in the film formation) can be reduced and the film thickness can be uniform. The thickness of the first oxide semiconductor layer is preferably 3 nm to 15 nm inclusive, and is 5 nm in an example of this embodiment. Note that an appropriate thickness differs depending on an oxide semiconductor material, the intended use, or the like, and the thickness may be set as appropriate in accordance with the material, the intended use, or the like.

Next, first heat treatment is performed on the first oxide semiconductor layer to crystallize at least a region including a surface of the first oxide semiconductor layer, whereby the first oxide semiconductor layer 104 is formed. Water (including hydroxyl), hydrogen, or the like in the first oxide semiconductor layer can be removed by the first heat treatment. The first heat treatment is performed in an atmosphere selected from nitrogen, a rare gas, oxygen, a mixed gas of nitrogen or a rare gas and oxygen, and dry air. The first heat treatment is performed at 400° C. to 800° C. inclusive, preferably 550° C. to 750° C. inclusive. Heating time is 1 minute to 24 hours inclusive. In this embodiment, as the first heat treatment, after dehydration or dehydrogenation is performed by heat treatment at 700° C. in a nitrogen atmosphere for 1 hour, the atmosphere is changed to an oxygen atmosphere to supply oxygen into the first oxide semiconductor layer.

Note that in the first heat treatment, it is preferable that water, hydrogen, or the like be not contained in nitrogen, oxygen, or a rare gas such as helium, neon, or argon. In addition, nitrogen, oxygen, or a rare gas such as helium, neon, or argon which is introduced into a heat treatment apparatus preferably has a purity of 6N (99.9999%) or higher, more preferably 7N (99.99999%) or higher (that is, the impurity concentration is 1 ppm or lower, preferably 0.1 ppm or lower). The first heat treatment may be performed in an ultra-dry air with a water concentration of 20 ppm or less, further preferably in an ultra-dry air with a water concentration of 1 ppm or less. Water (including hydroxyl), hydrogen, or the like in the first oxide semiconductor layer 104 can be removed by the above first heat treatment.

By the first heat treatment, a region in the first oxide semiconductor layer 104 which at least includes the surface of the first oxide semiconductor layer 104 becomes a crystal region. The crystal region formed in the region including the surface is formed by crystal growth from the surface toward the inside. The crystal region includes plate-like crystals whose average thickness is 2 nm to 10 nm inclusive. The crystal region is a region including crystals having the c-axis oriented substantially perpendicular to the surface. Here the term "substantially perpendicular" includes deviations within −10° to +10° inclusive from the perpendicular direction.

Note that the heat treatment apparatus for the first heat treatment is not limited particularly and the apparatus may be provided with a device for heating an object by heat conduction or thermal radiation from a heater such as a resistance heater. For example, an electric furnace, or a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus which performs heat treatment using a high-temperature gas.

Figure 2A:
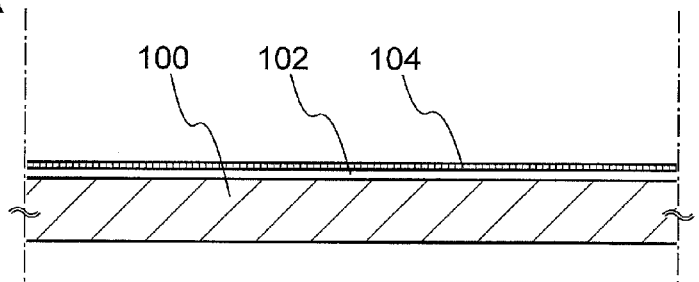
FIGS. 2A to 2E are cross-sectional views illustrating steps of one embodiment of the present invention.
Figure 2B:
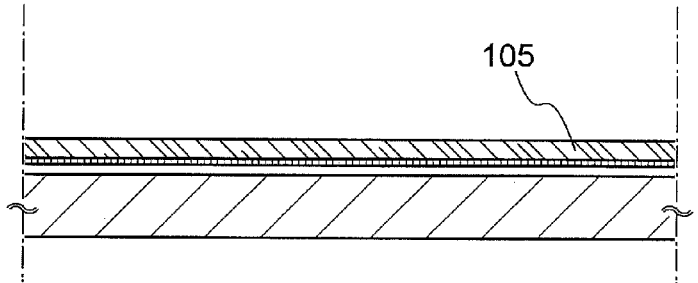

Next, a second oxide semiconductor layer 105 is formed over the first oxide semiconductor layer 104 which includes the crystal region in the region including at least the surface (see FIG. 2B).

For the second oxide semiconductor layer 105, a material which is similar to the material for the first oxide semiconductor layer can be used. For example, the second oxide semiconductor layer can be formed using In—Sn—Ga—Zn—O which is four-component metal oxide; In—Ga—Zn—O, In—Sn—Zn—O, In—Al—Zn—O, Sn—Ga—Zn—O, Al—Ga—Zn—O, or Sn—Al—Zn—O which are three-component metal oxide; In—Zn—O, Sn—Zn—O, Al—Zn—O, Zn—Mg—O, Sn—Mg—O, or In—Mg—O which are two-component metal oxide; or In—O, Sn—O, Zn—O, or the like.

Note that it is preferable that the first oxide semiconductor layer 104 and the second oxide semiconductor layer 105 be formed using materials including the same main component. However, the first oxide semiconductor layer 104 and the second oxide semiconductor layer 105 may be formed using materials having different main components, if they have the same crystal structure and lattice constants close to each other (a lattice constant mismatch of 1% or less).

In the case of using materials including the same main component, crystal growth is easily caused in later crystallization of the second oxide semiconductor layer 105 because the crystal region in the first oxide semiconductor layer 104 serves as a seed. In addition, the use of materials including the same main component is suitable for application to power devices or the like because the effective thickness of the film can be increased. Further, favorable interface characteristics such as adhesiveness or favorable electrical characteristics can be obtained.

In this embodiment, the second oxide semiconductor layer 105 is formed by a sputtering method using an In—Ga—Zn—O-based metal oxide target. The deposition of the second oxide semiconductor layer 105 by a sputtering method may be conducted in a manner similar to the above deposition of first oxide semiconductor layer by a sputtering method. Note that the thickness of the second oxide semiconductor layer 105 is preferably larger than that of the first oxide semiconductor layer 104. For example, the second oxide semiconductor layer 105 is preferably formed so that the total thicknesses of the first oxide semiconductor layer 104 and the second oxide semiconductor layer 105 may be 3 nm to 50 nm inclusive. Note that an appropriate thickness differs depending on an oxide semiconductor material, the intended use, or the like, and the thickness may be set as appropriate in accordance with the material, the intended use, or the like.

Next, second heat treatment is performed on the second oxide semiconductor layer 105 to cause crystal growth using the crystal region in the first oxide semiconductor layer 104 as a seed. Thus, a second oxide semiconductor layer 106 is formed (see FIG. 2C).

The second heat treatment is performed under a condition including one or more combinations of a temperature and an atmosphere where the temperature is selected from 400° C. to 800° C. inclusive and the atmosphere is selected from nitrogen, a rare gas, oxygen, a mixed gas of nitrogen or a rare gas and oxygen, and dry air. A heating time for crystallization of the second oxide semiconductor layer is 1 minute to 24 hours inclusive. If a heat treatment apparatus such as an electric furnace is used, the heating time is preferably 5 hours to 20 hours inclusive, typically 10 hours. If a rapid thermal annealing apparatus such as an RTA apparatus is used, the heating time is 1 minute to 30 minutes inclusive, or preferably 1 minute to 10 minutes inclusive, typically 5 minutes.

In this embodiment, the second heat treatment includes two steps: a first step for promoting crystallization and dehydration or dehydrogenation of the second oxide semiconductor layer 106, and a second step for filling oxygen vacancies in the crystallized second oxide semiconductor layer 106. In this case, the temperature in the first step is preferably 550° C. to 800° C. inclusive, and more preferably 600° C. to 750° C. inclusive; the temperature in the second step is preferably 400° C. to 600° C. inclusive, and more preferably 450° C. to 550° C. inclusive.

In the first step, heat treatment is performed in a nitrogen atmosphere at 650° C. for 6 minutes with an RTA apparatus. In the second step, heat treatment is performed in a mixed gas atmosphere of oxygen and nitrogen at 450° C. for 60 minutes. The number of steps is not limited to two and may be increased in accordance with the conditions which can be adjusted as appropriate. For example, a condition for the first step and a condition for the second step may be repeatedly employed. Note that since high-temperature heat treatment under nitrogen or a rare gas atmosphere may result in an increase in oxygen vacancies, the second heat treatment is preferably finished under a heat treatment condition including an atmosphere containing oxygen. In addition, in the heat treatment in an atmosphere containing oxygen, the oxygen concentration of the atmosphere may be increased over heat treatment time. Further, a gas containing oxygen may be used as the atmosphere in the first step in order to promote crystallization and dehydration or dehydrogenation as well as to fill oxygen vacancies; in this case, the second and later steps may be omitted.

By thus performed heat treatment at a constant temperature in an atmosphere containing oxygen, oxygen is efficiently supplied to fill oxygen vacancies in the oxide semiconductor, whereby variation in electrical characteristics can be suppressed.

Note that also in the second heat treatment, it is preferable that water, hydrogen, or the like be not contained in nitrogen, oxygen, or a rare gas such as helium, neon, or argon. In addition, nitrogen, oxygen, or a rare gas such as helium, neon, or argon which is introduced into a heat treatment apparatus preferably has a purity of 6N or higher, more preferably 7N or higher. The second heat treatment may be performed in an ultra-dry air with a water concentration of 20 ppm or less, further preferably in an ultra-dry air with a water concentration of 1 ppm or less. Water (including hydroxyl), hydrogen, or the like in the second oxide semiconductor layer 106 can be removed by the above second heat treatment. Thus, the first oxide semiconductor layer 104 and the second oxide semiconductor layer 106, which are highly purified by reduction of impurities and made to be i-type or substantially i-type oxide semiconductor layers, can be formed.

In addition, the second heat treatment may be performed in such a manner that the atmosphere in a furnace is a nitrogen atmosphere when the temperature is increased and the atmosphere is oxygen or an atmosphere containing oxygen when the temperature is decreased. By changing the atmosphere to an oxygen atmosphere after crystallization and dehydration or dehydrogenation in a nitrogen atmosphere, oxygen can be supplied into the second oxide semiconductor layer 106.

In this manner, the second heat treatment can crystallize the entire second oxide semiconductor layer 105 using the first oxide semiconductor layer 104 as a seed crystal, whereby the second oxide semiconductor layer 106 can be formed. Further, by the second heat treatment, the first oxide semiconductor layer 104 can be a crystal layer having higher orientation.

For example, in the case where an In—Ga—Zn—O-based oxide semiconductor material is used for the second oxide semiconductor layer 106, the second oxide semiconductor layer 106 can include a crystal represented by $In_2Ga_2ZnO_7$ (In:Ga:Zn:O=2:2:1:7) or the like. Owing to the second heat treatment, the c-axis of such crystals is oriented in a direction substantially perpendicular to the surface of the oxide semiconductor layer 106.

Here, the above crystal includes any of In, Ga, and Zn, and can be considered to have a stacked structure of layers parallel to the a-axis and the b-axis. Specifically, the above crystal has a structure in which a layer including In and a layer not including In (a layer including Ga or Zn) are stacked in the c-axis direction.

In the In—Ga—Zn—O-based oxide semiconductor crystal, the conductivity of the layer including In is favorable in a direction parallel to the a-axis and the b-axis. This is due to the fact that electrical conductivity is mainly determined by In in the In—Ga—Zn—O-based oxide semiconductor crystal and the fact that the 5 s orbital of one In atom overlaps with the 5 s orbital of an adjacent In atom, thus a carrier path is formed.

In the case where the first oxide semiconductor layer 104 includes an amorphous region in the vicinity of the interface with the insulating layer 102, the second heat treatment may cause crystal growth from the crystal region formed on the surface of the first oxide semiconductor layer 104 toward the bottom surface of the first oxide semiconductor layer and may crystallize the amorphous region in some cases. Note that depending on the materials forming the insulating layer 102 or heat treatment conditions, the amorphous region may remain.

Figure 2C:
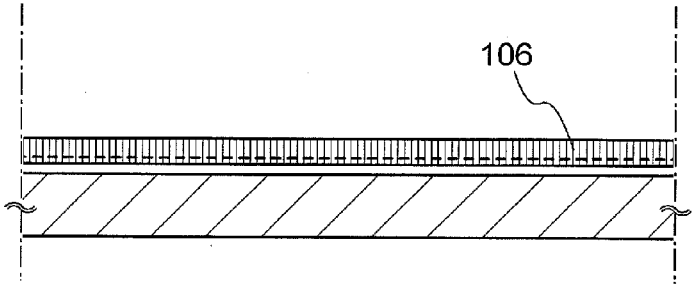

In the case where the first oxide semiconductor layer 104 and the second oxide semiconductor layer 105 are formed using oxide semiconductor materials including the same main component, as illustrated in FIG. 2C, crystal growth occurs upward to the surface of the second oxide semiconductor layer 105 using the first oxide semiconductor layer 104 as a seed crystal, whereby the second oxide semiconductor layer 106 is formed. The first oxide semiconductor layer 104 and the second oxide semiconductor layer 106 thus have the same crystal structure. Although the boundary between the first oxide semiconductor layer 104 and the second oxide semiconductor layer 106 is indicated by a dotted line in FIG. 2C, it sometimes cannot be identified, and the first oxide semiconductor layer 104 and the second oxide semiconductor layer 106 can be sometimes regarded as one layer.

Note that the heat treatment apparatus used for the second heat treatment can be used under conditions similar to those of the first heat treatment.

Figure 2D:
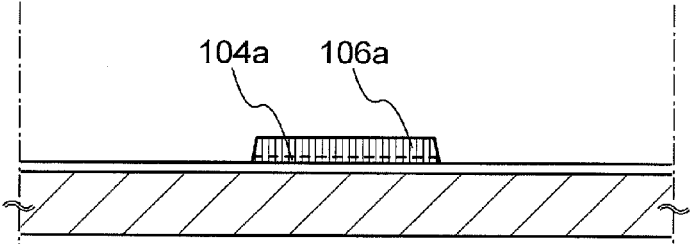

Then, the first oxide semiconductor layer 104 and the second oxide semiconductor layer 106 are processed by a method such as etching using a photoresist mask, whereby an island-shaped first oxide semiconductor layer 104*a* and an island-shaped second oxide semiconductor layer 106*a* are formed (see FIG. 2D).

For etching the oxide semiconductor layer, either dry etching or wet etching may be employed. Needless to say, dry etching and wet etching can be used in combination. The etching conditions (such as an etchant, etching time, and temperature) are set as appropriate depending on the material so that the oxide semiconductor layer may be etched into a desired shape.

Examples of an etching gas which can be used for dry etching include a gas containing chlorine (a chlorine-based gas such as chlorine ($Cl_2$), boron trichloride ($BCl_3$), silicon tetrachloride ($SiCl_4$), or carbon tetrachloride ($CCl_4$)). Further, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like may be used.

Examples of an etchant that can be used for wet etching are a mixed solution of phosphoric acid, acetic acid, and nitric acid; and an ammonia peroxide mixture (hydrogen peroxide solution of 31 wt %: ammonia solution of 28 wt %: water=5: 2:2). Further, an etchant such as ITO-07N (produced by KANTO CHEMICAL CO., INC.) may be used.

Figure 2E:
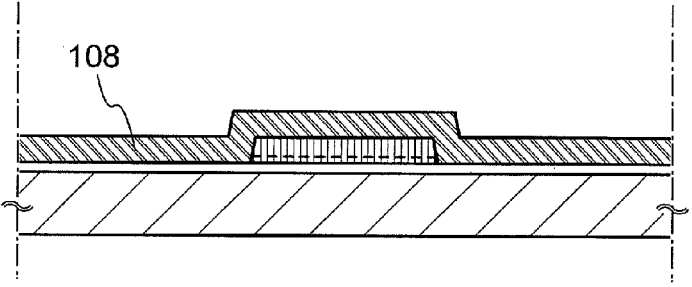

Then, a conductive layer 108 is formed in contact with the second oxide semiconductor layer 106*a* (see FIG. 2E).

The conductive layer 108 can be formed by a PVD method such as a sputtering method, or a CVD method such as a plasma CVD method. The conductive layer 108 can be formed using an element selected from aluminum, chromium, copper, tantalum, titanium, molybdenum, and tungsten, an alloy thereof, or the like. The conductive layer 108 may be formed using a material including one or more of manganese, magnesium, zirconium, and beryllium. Further, a material including aluminum and one or more of elements selected from titanium, tantalum, tungsten, molybdenum, chromium, neodymium, and scandium may be used. As another material of the conductive layer 108, a material having a high barrier property, such as titanium nitride or tantalum nitride, may be used. The use of a material having a high barrier property, such as a titanium nitride film or a tantalum nitride film, in a portion which is in contact with the second oxide semiconductor layer 106*a* can suppress entry of impurities into the second oxide semiconductor layer 106*a* and prevent an adverse effect on transistor characteristics.

Alternatively, the conductive layer 108 may be formed using conductive metal oxide. Examples of conductive metal oxide include indium oxide, tin oxide, zinc oxide, indium tin oxide (which may be abbreviated to ITO), indium zinc oxide, and any of these metal oxide materials containing silicon or silicon oxide.

The conductive layer 108 preferably has a three-layer structure in which a titanium layer, an aluminum layer, and a titanium layer are stacked in this order. Alternatively, the conductive layer 108 can have a two-layer structure in which an aluminum layer and a tungsten layer are stacked, a two-layer structure in which a copper layer and a tungsten layer are stacked, or a two-layer structure in which an aluminum layer and a molybdenum layer are stacked. Needless to say, the conductive layer 108 may have a single-layer structure or a stacked-layer structure including four or more layers. Here, a single-layer titanium film is employed. In the case of using the single-layer titanium film, a favorable tapered shape can be obtained by etching to be performed later.

Figure 3A:
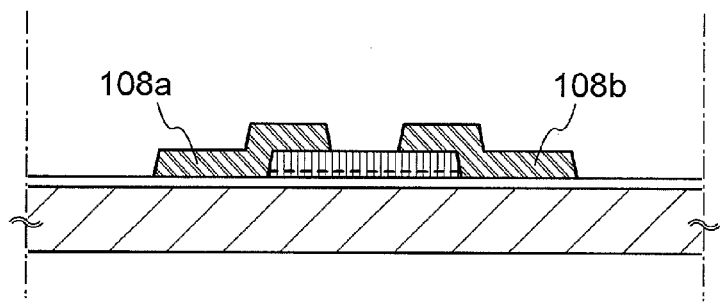
FIGS. 3A to 3D are cross-sectional views illustrating steps of one embodiment of the present invention.

Then, the conductive layer 108 is selectively etched to form a source electrode layer 108*a* and a drain electrode layer 108*b* (see FIG. 3A).

Ultraviolet, a KrF laser light, or an ArF laser light is preferably used for light exposure for forming a photoresist mask for the etching. Particularly, when light exposure is performed for the channel length (L) of less than 25 nm, extreme ultraviolet with extremely short wavelengths of several nanometers to several tens of nanometers is preferably used for light exposure for forming the mask. Light exposure with extreme ultraviolet leads to a high resolution and a large depth of focus. Therefore, the channel length (L) of a transistor, which is formed later, can be 10 nm to 1000 nm (1 μm) inclusive. By thus decreasing the channel length, operation speed can be improved. In addition, the off-state current of a transistor including the above-described oxide semiconductor is extremely small; thus, an increase in power consumption due to miniaturization can be suppressed.

The materials and etching conditions of the conductive layer 108 and the second oxide semiconductor layer 106*a* are adjusted as appropriate so that the second oxide semiconductor layer 106*a* may be prevented from being removed in etching of the conductive layer 108. Note that the second oxide semiconductor layer 106*a* is partly etched in this step to be an oxide semiconductor layer having a groove (a depressed portion) in some cases depending on the materials and etching conditions.

Further, the crystal layer in contact with the source electrode layer 108*a* and the drain electrode layer 108*b* may be in an amorphous state in the vicinity of side surfaces of the first oxide semiconductor layer 104*a* and the second oxide semiconductor layer 106*a* in some cases.

Figure 3B:
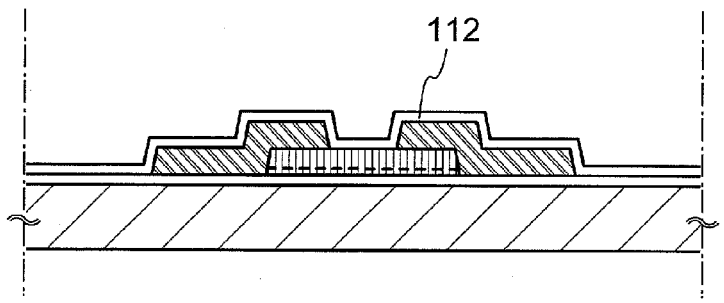

Next, a gate insulating layer 112 is formed in contact with part of the second oxide semiconductor layer 106*a* (see FIG. 3B). The gate insulating layer 112 can be formed by a plasma CVD method, a sputtering method, or the like. The gate insulating layer 112 is preferably formed using silicon oxide, silicon oxynitride, silicon nitride oxide, aluminum oxide, hafnium oxide, tantalum oxide, or the like. Note that the gate insulating layer 112 may have a single-layer structure or a stacked-layer structure. In the case where a stacked-layer structure is employed, any of the above materials is used for a layer in contact with the oxide semiconductor and a silicon nitride film can be formed thereover. There is no particular limitation on the thickness of the gate insulating layer 112; the gate insulating layer 112 can have a thickness of 10 nm to 500 nm inclusive, preferably 50 nm to 200 nm inclusive, for example.

In this embodiment, a silicon oxide film is formed by a sputtering method in an oxygen atmosphere to form the gate insulating layer 112. Oxygen can be supplied to a part of the second oxide semiconductor layer 106*a* at the time of the formation of the gate insulating layer 112.

Further, a dense and high-quality gate insulating layer having high breakdown voltage may be formed as the gate insulating layer 112 with a high-density plasma apparatus which can realize a plasma density of $1\times10^{11}/cm^3$ or more.

Then, third heat treatment is preferably performed in an inert gas atmosphere or an oxygen atmosphere. The third heat treatment is performed at 200° C. to 450° C. inclusive, preferably 250° C. to 350° C. inclusive. For example, the third heat treatment may be performed at 250° C. for 1 hour in an atmosphere containing oxygen. By the third heat treatment, oxygen is supplied to the second oxide semiconductor layer 106*a* and oxygen vacancies in the second oxide semiconductor layer 106*a* can be further reduced.

Figure 3C:
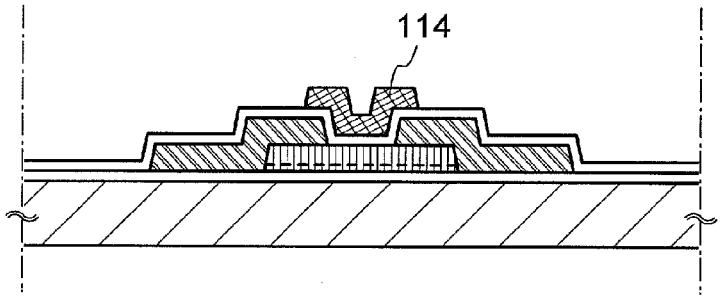

Then, a gate electrode layer 114 is formed over a region of the gate insulating layer 112 which overlaps with the first oxide semiconductor layer 104a and the second oxide semiconductor layer 106a (see FIG. 3C). The gate electrode layer 114 can be formed by forming a conductive layer over the gate insulating layer 112 and then selectively patterning the conductive layer.

The conductive layer can be formed by a PVD method such as a sputtering method, or a CVD method such as a plasma CVD method. The conductive layer can be formed using an element selected from aluminum, chromium, copper, tantalum, titanium, molybdenum, and tungsten, an alloy thereof, or the like. Further, nitride of those elements such as titanium nitride or tantalum nitride may be used. Further, a material including one or more of manganese, magnesium, zirconium, and beryllium may be used. Further, a material including aluminum and one or more of elements selected from titanium, tantalum, tungsten, molybdenum, chromium, neodymium, and scandium may be used.

Figure 3D:
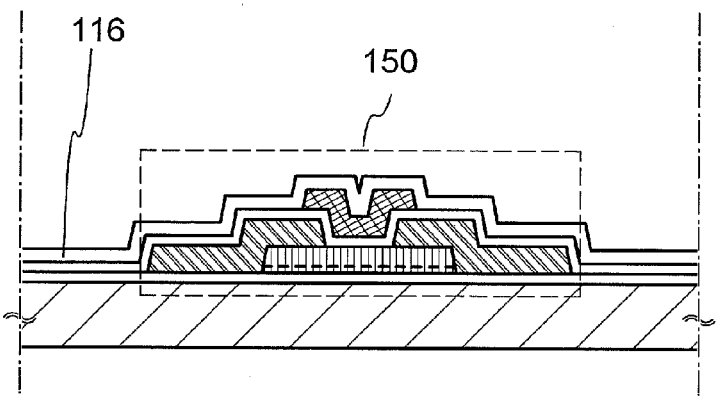

After an interlayer insulating layer 116 containing hydrogen is formed over the gate insulating layer 112 and the gate electrode layer 114, fourth heat treatment is performed (see FIG. 3D). The interlayer insulating layer 116 containing hydrogen can be formed by a plasma CVD method or the like. In this embodiment, a silicon nitride film which is one of nitride insulating layers obtained by a plasma CVD method is used.

The fourth heat treatment is performed in a nitrogen atmosphere at 150° C. to 450° C. inclusive, preferably at 250° C. to 440° C. inclusive. The fourth heat treatment may be performed in an oxygen atmosphere, a rare gas atmosphere, or a dry air atmosphere without limitation to a nitrogen atmosphere.

The fourth heat treatment after the formation of the interlayer insulating layer 116 containing hydrogen is a step in which hydrogen contained in the interlayer insulating layer 116 is diffused to terminate defects inside and at an interface of the first oxide semiconductor layer 104a and the second oxide semiconductor layer 106a (e.g., dangling bonds of Si at an interface between the oxide insulating layer and the oxide semiconductor layers, or dangling bonds of oxygen or the like in the oxide semiconductor). Hydrogen can be diffused into the first oxide semiconductor layer 104a and the second oxide semiconductor layer 106a or at the interface between these oxide semiconductor layers and the oxide insulating layer regardless of existence of the insulating film (the gate insulating layer 112) formed of a silicon oxide film.

As described above, the first oxide semiconductor layer 104a and the second oxide semiconductor layer 106a, which is formed by crystal growth from the crystal region in the first oxide semiconductor layer 104a, serve as a channel formation region, and defects in the oxide semiconductor and the interface between the layers are terminated by hydrogen diffused from the interlayer insulating layer 116. Thus, the transistor 150 is completed.

Then, an interlayer insulating layer 118 is formed over the interlayer insulating layer 116. A cross-sectional structure illustrated in FIG. 1 is obtained. The interlayer insulating layer 118 is formed by a PVD method, a CVD method, or the like using a material including an inorganic insulating material such as silicon oxide, silicon nitride oxide, silicon nitride, hafnium oxide, aluminum oxide, or tantalum oxide. Further, an organic resin such as polyimide, acrylic, benzocyclobutene, polyamide, or epoxy can be used for a material of the interlayer insulating layer 118. Note that a stacked-layer structure of the interlayer insulating layers 116 and 118 is used in this embodiment, but an embodiment of the present invention is not limited to this example. A single-layer structure or a stacked-layer structure including three or more layers can also be employed.

Note that the interlayer insulating layer 118 is preferably formed to have a flat surface. This is because an electrode, a wiring, or the like can be favorably formed over the interlayer insulating layer 118 when the interlayer insulating layer 118 is formed to have a flat surface.

The transistor 150 illustrated in FIG. 1 includes the first oxide semiconductor layer 104a provided over the substrate 100 with the insulating layer 102 therebetween; the second oxide semiconductor layer 106a provided over the first oxide semiconductor layer 104a; the source electrode layer 108a and the drain electrode layer 108b which are electrically connected to the second oxide semiconductor layer 106a; the gate insulating layer 112 in contact with the second oxide semiconductor layer 106a; and the gate electrode layer 114 over the gate insulating layer 112.

In the first oxide semiconductor layer 104a and the second oxide semiconductor layer 106a, the carrier concentration is sufficiently low (e.g., lower than $1 \times 10^{12}/cm^3$, preferably lower than $1.45 \times 10^{10}/cm^3$) as compared with the carrier concentration of a general silicon wafer (approximately $1 \times 10^{14}/cm^3$). At a drain voltage in the range of from 1V to 10V, the off-state current (current flowing between the source and the drain when the gate-source voltage is 0V or less) is $1 \times 10^{-13}$ A or less or the off-state current density (a value obtained by dividing an off-state current by a channel width of a transistor) is 10 aA/μm ("a" represents "atto" and denotes a factor of $10^{-18}$) or less, preferably 1 aA/μm or less, and further preferably 100 zA/μm ("z" represents "zepto" and denotes a factor of $10^{-21}$) or less, in the case where the channel length is 10 μm and the total thickness of the oxide semiconductor layers is 30 nm. Note that the resistance at the time when the transistor is off (off-state resistance R) can be calculated using Ohm's law from the off-state current and the drain voltage. Further, the off-state resistivity ρ can be calculated using the formula: ρ=RA/L (R is the off-state resistance), from the cross-sectional area A of the channel formation region and the channel length L. The off-state resistivity is preferably $1 \times 10^9$ Ω·m or higher (or $1 \times 10^{10}$ Ω·m). Here, the cross-section area A can be obtained in accordance with the formula A=dW where d is the thickness of the channel formation region and W is the channel width.

Since hydrogen contained in the interlayer insulating layer 116 is diffused into the first oxide semiconductor layer 104a and the second oxide semiconductor layer 106a by heating, the carrier concentration may be $1 \times 10^{14}/cm^3$ or more and less than $1 \times 10^{18}/cm^3$ depending on the amount of the diffused hydrogen.

The off-state current of a transistor including amorphous silicon is approximately $10^{-12}$ A, whereas the off-state current of a transistor including an oxide semiconductor is 1/10000 or less of that of the transistor including amorphous silicon. The transistor 150 with extremely excellent off-state current characteristics can be thus obtained with the use of an oxide semiconductor having a wide band gap and improved quality.

In the case where the first oxide semiconductor layer 104a and the second oxide semiconductor layer 106a are formed using the same material (i.e., in the case of homoepitaxial growth), the boundary between the first oxide semiconductor layer 104a and the second oxide semiconductor layer 106a cannot be identified, although the boundary is shown by dotted lines in FIG. 1. In that case, the first oxide semiconductor layer 104a and the second oxide semiconductor layer 106a can be regarded as one layer. In addition, both the first oxide semiconductor layer 104a and the second oxide semiconductor layer 106a are non-single-crystal layers.

The first oxide semiconductor layer 104a and the second oxide semiconductor layer 106a may be formed using different materials. In the case where the first oxide semiconductor layer 104a and the second oxide semiconductor layer 106a are formed using different materials (i.e., in the case of hetero epitaxial growth), for example, the first oxide semiconductor layer 104a can be formed using In—Zn—O which is two-component metal oxide, and the second oxide semiconductor layer 106a can be formed using In—Ga—Zn—O which is three-component metal oxide.

A region serving as a channel formation region in the oxide semiconductor layer preferably has at least a flat surface. Furthermore, the first oxide semiconductor layer and the second oxide semiconductor layer are c-axis-oriented non-single-crystal layers. Note that the variation in height of the surface of the second oxide semiconductor layer is preferably 1 nm or less (further preferably 0.2 nm or less) in a region overlapping with the gate electrode layer (the channel formation region).

This embodiment can be implemented in appropriate combination with any structure described in the other embodiments.

Embodiment 2

While an example of manufacturing a top-gate transistor is described in Embodiment 1, an example of manufacturing a bottom-gate transistor will be described in this embodiment.

First, a conductive film is formed over a substrate having an insulating surface, and then a gate electrode layer 401 is formed by a photolithography step using a photomask.

As a substrate 400, a substrate of a glass material such as aluminosilicate glass, aluminoborosilicate glass, or barium borosilicate glass, a silicon substrate, a quartz substrate, or the like is used.

In this embodiment, a glass substrate is used as the substrate 400, and heat treatment at 650° C. for 6 minutes is performed twice on the substrate 400 because heat treatment will be performed later for crystallization of an oxide semiconductor layer which is to be formed. By heating the substrate before the film formation, film peeling or misalignment of a photoresist mask due to shrink of the substrate can be suppressed.

An insulating layer serving as a base layer may be provided between the substrate 400 and the gate electrode layer 401. The base layer has a function of preventing diffusion of an impurity element from the substrate 400, and can be formed to have a single-layer or stacked-layer structure including one or more of a silicon nitride layer, a silicon oxide layer, a silicon nitride oxide layer, and a silicon oxynitride layer.

A metal layer can be used as the gate electrode layer 401. As a material of the metal layer, an element selected from aluminum, chromium, copper, tantalum, titanium, molybdenum, and tungsten, an alloy containing any of these elements as a component, an alloy containing any of these the elements in combination, or the like is preferably used. For example, the metal layer preferably has a three-layer structure in which a titanium layer, an aluminum layer, and a titanium layer are stacked in this order. Needless to say, the metal layer can have a single layer, two-layer, or stacked-layer structure including four or more layers. In the case where heat treatment is performed later, a material which can withstand a temperature of the heat treatment is preferably selected for the gate electrode layer 401.

Next, a gate insulating layer 402 is formed over the gate electrode layer 401. The gate insulating layer 402 can be formed to have a single layer or a stacked-layer structure of a silicon oxide layer, a silicon nitride layer, a hafnium oxide layer, a silicon oxynitride layer, or a silicon nitride oxide layer by a CVD method, a sputtering method, or the like. For example, a stacked-layer including a silicon nitride film and a silicon oxide film is used. The film thickness of the gate insulating layer 402 is 50 nm to 200 nm inclusive.

In this embodiment, the gate insulating layer 402 is formed with a high-density plasma apparatus. Here, a high-density plasma apparatus refers to an apparatus which can realize a plasma density of $1\times10^{11}/cm^3$ or higher. For example, plasma is generated by applying a microwave power of 3 kW to 6 kW for the formation of the insulating film.

A monosilane gas ($SiH_4$), nitrous oxide ($N_2O$), and a rare gas are introduced into a chamber as a source gas, and high-density plasma is generated at a pressure of 10 Pa to 30 Pa inclusive to form an insulating film over a substrate having an insulating surface such as a glass substrate. After that, supply of a monosilane gas is stopped and nitrous oxide ($N_2O$) and a rare gas are introduced without exposure to air, and thus plasma treatment may be performed on a surface of the insulating film. The plasma treatment performed on the surface of the insulating film by introducing at least nitrous oxide ($N_2O$) and a rare gas is performed after the insulating film is formed. The insulating film formed through the above process procedure has reliability even though it has a thickness of less than 100 nm, for example.

In this embodiment, a silicon oxynitride film (also referred to as $SiO_xN_y$, where x>y>0) with a thickness of 100 nm which is formed with a high-density plasma apparatus is used as the gate insulating layer 402.

Then, a first oxide semiconductor layer having a thickness of 2 nm to 15 nm inclusive is formed over the gate insulating layer 402. The first oxide semiconductor layer can be formed by a sputtering method in a rare gas (typically, argon) atmosphere, an oxygen atmosphere, or a mixed atmosphere of a rare gas (typically, argon) and oxygen. In this embodiment, since the formed oxide semiconductor layer is subjected to heat treatment for intentional crystallization in a later step, it is preferable to use an oxide semiconductor target whose composition facilitates generation of crystals.

Then, the first oxide semiconductor layer is subjected to first heat treatment to crystallize at least part of the first oxide semiconductor layer. The temperature of the first heat treatment is 400° C. to 800° C. inclusive. Heating time is 1 minute to 24 hours inclusive. The first heat treatment is performed in an atmosphere selected from nitrogen, a rare gas, oxygen, a mixed gas of nitrogen or a rare gas and oxygen, and dry air. By the first heat treatment, a first oxide semiconductor layer 404 which is a crystal layer obtained by crystal growth proceeding from a surface is formed (see FIG. 4A). The crystal layer formed at the surface has the c-axis oriented in a direction substantially perpendicular to the surface.

Note that in the first heat treatment, it is preferable that water, hydrogen, or the like be not contained in nitrogen, oxygen, or a rare gas such as helium, neon, or argon. In addition, nitrogen, oxygen, or a rare gas such as helium, neon, or argon which is introduced into a heat treatment apparatus preferably has a purity of 6N or higher, more preferably 7N or higher. Further, the first heat treatment may be performed in an ultra-dry air atmosphere with a water concentration of 20 ppm or less.

In addition, the first heat treatment may be performed in such a manner that the atmosphere in a furnace is a nitrogen atmosphere when the temperature is increased and the atmosphere is changed to oxygen atmosphere when the temperature is decreased. By changing the atmosphere to an oxygen atmosphere after the dehydration or dehydrogenation in a nitrogen atmosphere, oxygen can be supplied into the first oxide semiconductor layer so that the first oxide semiconductor layer may have i-type conductivity.

Then, a second oxide semiconductor layer whose thickness is larger than at least that of the first oxide semiconductor layer 404 is formed over the first oxide semiconductor layer 404 having a plate-like crystal. Note that the thickness of the second oxide semiconductor layer may be determined as appropriate in accordance with an aimed device to be formed, by a practitioner. For example, in the case of manufacturing a bottom-gate transistor, the total thickness of the first oxide semiconductor layer 404 and the second oxide semiconductor layer is 10 nm to 200 nm inclusive.

It is preferable that the first oxide semiconductor layer and the second oxide semiconductor layer be formed using materials including the same main component or that they have the same crystal structure and lattice constants close to each other (a lattice constant mismatch of 1% or less). In the case of using materials including the same main component, crystal growth is easily caused in later crystallization because the plate-like crystal in the first oxide semiconductor layer serves as a seed. Further, when the materials have the same components, interface characteristics such as adhesiveness or favorable electric characteristics can be obtained.

Then, the second heat treatment is performed for crystal growth using the crystal layer in the first oxide semiconductor layer as a seed crystal. The second heat treatment is performed under a condition including one or more combinations of a temperature and an atmosphere where the temperature is selected from 400° C. to 800° C. inclusive and the atmosphere is selected from nitrogen, a rare gas, oxygen, a mixed gas of nitrogen or a rare gas and oxygen, and dry air. A heating time for crystallization of the second oxide semiconductor layer is 1 minute to 24 hours inclusive. If a heat treatment apparatus such as an electric furnace is used, the heating time is preferably 5 hours to 20 hours inclusive, typically 10 hours. If a rapid thermal annealing apparatus such as an RTA apparatus is used, the heating time is 1 minute to 30 minutes inclusive, preferably 1 minute to 10 minutes inclusive, typically 5 minutes. Thus, a second oxide semiconductor layer 406 which is crystallized can be obtained (see FIG. 4B).

In this embodiment, the second heat treatment includes two steps: a first step for promoting crystallization and dehydration or dehydrogenation of the second oxide semiconductor layer, and a second step for filling oxygen vacancies in the crystallized second oxide semiconductor layer 406. In this case, the temperature in the first step is preferably 550° C. to 800° C. inclusive, and more preferably 600° C. to 750° C. inclusive; the temperature in the second step is preferably 400° C. to 600° C. inclusive, and more preferably 450° C. to 550° C. inclusive.

In the first step, heat treatment is performed in a nitrogen atmosphere at 650° C. for 6 minutes with an RTA apparatus. In the second step, heat treatment is performed in a mixed gas atmosphere of oxygen and nitrogen at 450° C. for 60 minutes. The number of steps is not limited to two and may be increased in accordance with the conditions which can be adjusted as appropriate. For example, a condition for the first step and a condition for the second step may be repeatedly employed. Note that since high-temperature heat treatment under nitrogen or a rare gas atmosphere may result in an increase of oxygen vacancies, the second heat treatment is preferably finished under a heat treatment condition including an atmosphere containing oxygen. In addition, in the heat treatment in an atmosphere containing oxygen, the oxygen concentration of the atmosphere may be increased over heat treatment time. Further, a gas containing oxygen may be used as the atmosphere in the first step in order to promote crystallization and dehydration or dehydrogenation as well as to fill the oxygen vacancies; in this case, the second and later steps may be omitted.

By thus performed heat treatment at a constant temperature in an atmosphere containing oxygen, oxygen is efficiently supplied to fill vacancies in the oxide semiconductor, whereby variation in electrical characteristics can be suppressed.

Then, an oxide semiconductor layer formed of the first oxide semiconductor layer 404 and the second oxide semiconductor layer 406 is processed into an island-shaped first oxide semiconductor layer 404a and an island-shaped second oxide semiconductor layer 406a through a photolithography step and an etching step. Then, a metal conductive film is formed over the gate insulating layer 402, the first oxide semiconductor layer 404a, and the second oxide semiconductor layer 406a by a sputtering method or the like. After that, a photolithography step is performed, whereby a resist mask is formed and selective etching is performed to form a metal electrode layer serving as a source electrode layer and a drain electrode layer.

As a material of a metal conductive film which becomes the metal electrode layer (and a wiring which is formed using the same layer), a metal material such as aluminum, chromium, copper, tantalum, titanium, molybdenum, or tungsten, an alloy material containing any of these metal materials as a component is used. Further when an aluminum material to which an element preventing hillocks and whiskers in an aluminum film, such as silicon, titanium, tantalum, tungsten, molybdenum, chromium, neodymium, scandium, or yttrium, is added is used, heat resistance can be increased.

For example, the metal film preferably has a three-layer structure in which a titanium layer, an aluminum layer, and a titanium layer are stacked in this order. Alternatively, the metal film can have a two-layer structure in which an aluminum layer and a tungsten layer are stacked, a two-layer structure in which a copper layer and a tungsten layer are stacked, or a two-layer structure in which an aluminum layer and a molybdenum layer are stacked. Needless to say, the metal film may have a single-layer structure or a stacked-layer structure including four or more layers.

Then, the resist mask is removed, and by a photolithography step, a resist mask is formed and selective etching is performed; thus, a source electrode layer 408a and a drain electrode layer 408b are formed. Then, the resist mask is removed. Note that in this photolithography step, the island-shaped second oxide semiconductor layer 406a may be partly etched in some cases to be an oxide semiconductor layer having a groove (a depression portion).

Further, in order to reduce the number of photomasks used in the photolithography steps and reduce the number of process steps, an etching step may be performed with the use of a multi-tone mask which is a light-exposure mask through which light is transmitted to have a plurality of intensities. A resist mask formed using a multi-tone mask has a plurality of thicknesses and can be changed in shape, and therefore, can be used in a plurality of etching steps to provide different patterns. Therefore, a resist mask corresponding to at least two kinds of different patterns can be formed using one multi-tone mask. Thus, the number of light-exposure masks can be reduced and the number of corresponding photolithography steps can also be reduced, whereby the process can be simplified.

Figure 4A:
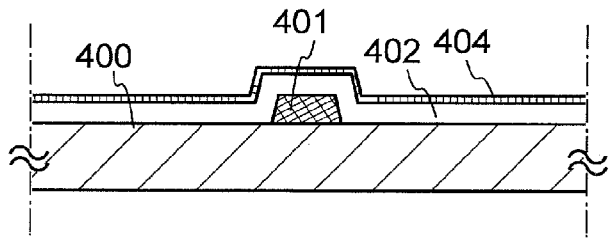
FIGS. 4A to 4E are cross-sectional views illustrating steps of one embodiment of the present invention.
Figure 4B:
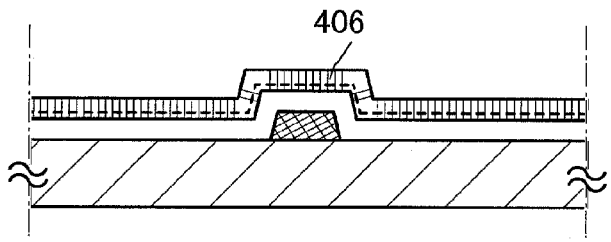
Figure 4C:
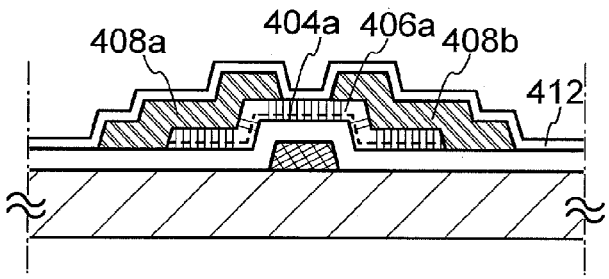

After an oxide insulating layer 412 serving as a protective insulating film is formed in contact with part of the oxide semiconductor layer, third heat treatment is performed (see FIG. 4C).

In this embodiment, a 300-nm-thick silicon oxide film is formed by a sputtering method, as the oxide insulating layer 412. The substrate temperature in the film formation may be room temperature to 300° C. inclusive. In this embodiment, the substrate temperature is 100° C. The formation of the silicon oxide film by a sputtering method can be performed in a rare gas (typically, argon) atmosphere, an oxygen atmosphere, or a mixed atmosphere of a rare gas (typically, argon) and oxygen. As a target, a silicon oxide target or a silicon target can be used. For example, with use of a silicon target, silicon oxide can be deposited by a sputtering method in an atmosphere of oxygen and nitrogen. The oxide insulating layer 412 formed in contact with the island-shaped first oxide semiconductor layer 404a and the island-shaped second oxide semiconductor layer 406a which are crystallized has a thickness of 10 nm to 500 nm inclusive and typically is a silicon oxide film, a silicon nitride oxide film, an aluminum oxide film, an aluminum oxynitride film, or the like.

The third heat treatment is performed at 200° C. to 450° C. inclusive, preferably 250° C. to 350° C. inclusive. For example, the third heat treatment may be performed at 250° C. for 1 hour in an atmosphere containing oxygen. Through the third heat treatment, oxygen is supplied to the first oxide semiconductor layer 404a and the second oxide semiconductor layer 406a to further reduce oxygen vacancies.

Figure 4D:
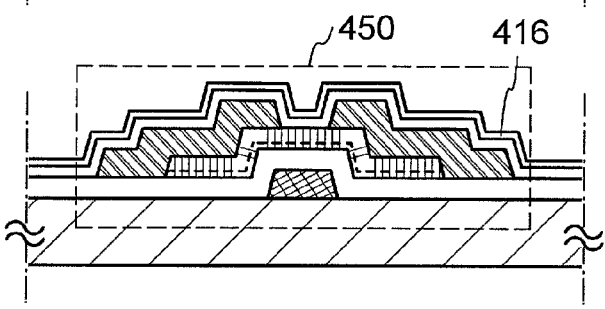

After an interlayer insulating layer 416 containing hydrogen is formed over the oxide insulating layer 412, fourth heat treatment is performed (see FIG. 4D). The interlayer insulating layer 416 containing hydrogen can be formed by a plasma CVD method or the like. In this embodiment, a silicon nitride film which is one of nitride insulating layers containing hydrogen obtained by a plasma CVD method is used.

The fourth heat treatment is performed in a nitrogen atmosphere at 150° C. to 450° C. inclusive, preferably at 250° C. to 440° C. inclusive. The fourth heat treatment may be performed in an oxygen atmosphere, a rare gas atmosphere, or a dry air atmosphere without limitation to a nitrogen atmosphere.

The fourth heat treatment after the formation of the interlayer insulating layer 416 containing hydrogen is a step in which hydrogen contained in the interlayer insulating layer 416 is diffused to terminate defects of the first oxide semiconductor layer 404a and the second oxide semiconductor layer 406a. Hydrogen can be diffused into the first oxide semiconductor layer 404a and the second oxide semiconductor layer 406a or at the interface between these oxide semiconductor layers and the oxide insulating layer regardless of existence of the insulating film (the oxide insulating layer 412) formed of a silicon oxide film.

As described above, the first oxide semiconductor layer 404a and the second oxide semiconductor layer 406a, which is formed by crystal growth from the crystal region in the first oxide semiconductor layer 404a, serve as a channel formation region, and defects in the oxide semiconductor and the interface between the layers are terminated by hydrogen diffused from the interlayer insulating layer 416. Thus, the transistor 450 is completed.

Figure 4E:
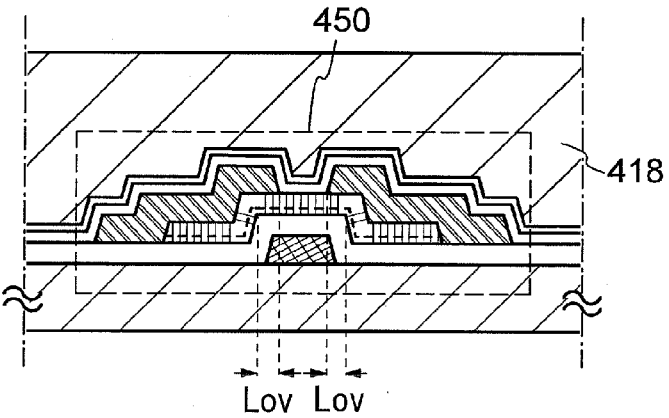

Then, an interlayer insulating layer 418 is formed over the interlayer insulating layer 416. A cross-sectional structure illustrated in FIG. 4E is obtained. The interlayer insulating layer 418 is formed by a PVD method, a CVD method, or the like using a material including an inorganic insulating material such as silicon oxide, silicon nitride oxide, silicon nitride, hafnium oxide, aluminum oxide, or tantalum oxide. Further, an organic resin such as acrylic can be used for a material of the interlayer insulating layer 418. Note that a stacked-layer structure of the interlayer insulating layers 416 and 418 is used in this embodiment, but an embodiment of the present invention is not limited to this example. A single-layer structure or a stacked-layer structure including three or more layers can also be employed.

As illustrated in FIG. 4E, the gate electrode layer 401 includes a region overlapping with the source electrode layer 408a (or the drain electrode layer 408b). A region (an $L_{OV}$ region in FIG. 4E) between an edge of the source electrode layer 408a and a step of the gate insulating layer 402, in other words, a region between the edge of the source electrode layer 408a and a point of the gate insulating layer at which a flat surface is changed to a tapered surface in the cross-sectional view is included. The $L_{OV}$ region is important for preventing carriers from flowing to a crystal grain boundary generated in the edge of the gate electrode layer.

Figure 5A:
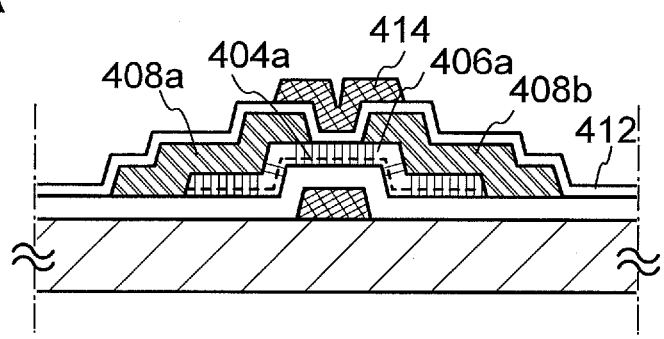
FIGS. 5A and 5B are cross-sectional views illustrating steps of one embodiment of the present invention.
Figure 5B:
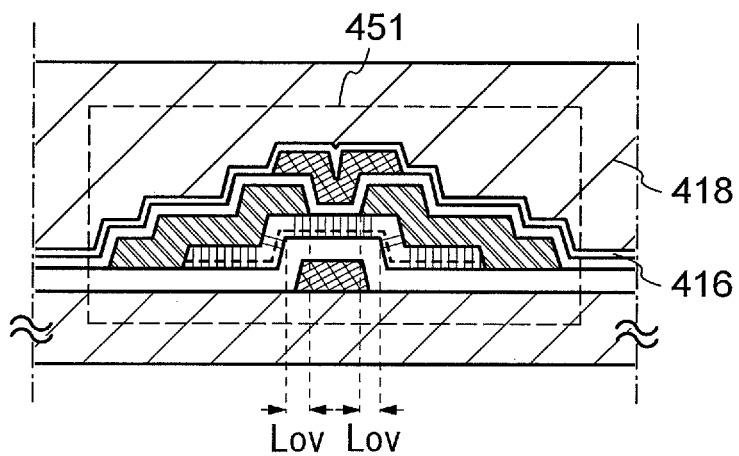

Furthermore, an electrode layer serving as a back gate may be formed over the oxide insulating layer 412. FIGS. 5A and 5B illustrate a manufacturing example of such a case. After a state of FIG. 4C is obtained, a contact hole reaching the gate electrode layer 401 is formed and an electrode layer 414 is formed over the oxide insulating layer 412 (see FIG. 5A). Then, the interlayer insulating layer 416 containing hydrogen is formed over the electrode layer 414 and the oxide insulating layer 412. Then, the fourth heat treatment is performed, and a transistor 451 illustrated in FIG. 5B can be obtained. The electrode layer 414 is provided at the position overlapping with the channel formation region in the oxide semiconductor layer, whereby the amount of change in threshold voltage of the transistor 451 between before and after a BT test (bias-temperature stress test) can be reduced. The electrode layer 414 may have a potential different from the gate electrode layer 401 of the transistor 451. Alternatively, the potential of the electrode layer 414 may be GND or 0 V, or the electrode layer 414 may be in a floating state.

Embodiment 3

Figure 6:
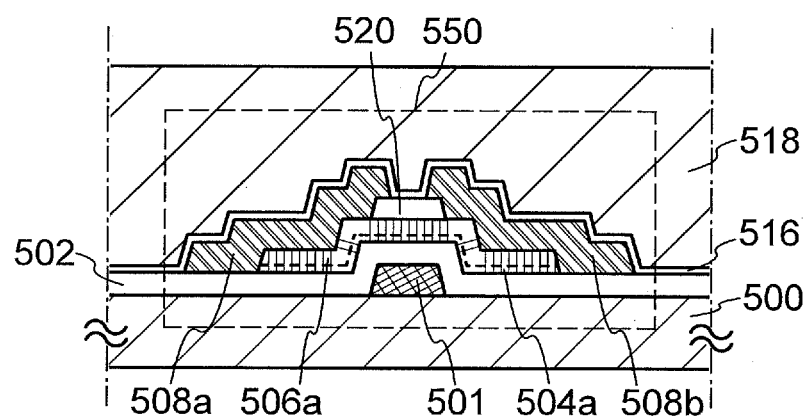
FIG. 6 is a cross-sectional view of one embodiment of the present invention.

In this embodiment, an example of a channel-protective transistor is described with reference to FIG. 6.

Since this embodiment is only partly different from Embodiment 2, detailed description is omitted here.

A process will be described below. Similarly to Embodiment 2, a gate electrode layer 501 and a gate insulating layer 502 are formed over a substrate 500. Then, similarly to Embodiment 2, a first oxide semiconductor layer is formed and subjected to first heat treatment to be crystallized; and a second oxide semiconductor layer is formed and subjected to second heat treatment to be crystallized.

Next, an oxide insulating layer is formed and third heat treatment is performed. The oxide insulating layer is formed using the same material as that of the oxide insulating layer 412 described in Embodiment 2. In addition, the conditions of the third heat treatment are the same as those of the third heat treatment described in Embodiment 2, and oxygen is supplied to the first oxide semiconductor layer and the second oxide semiconductor layer to reduce oxygen vacancies in the first oxide semiconductor layer and the second oxide semiconductor layer.

Then, a photolithography step is performed, whereby a resist mask is formed over the oxide insulating layer and selective etching is performed to form an island-shaped first oxide semiconductor layer 504a and an island-shaped second oxide semiconductor layer 506a.

Then, the resist mask is removed. Then, a photolithography step is performed, whereby a resist mask is formed and selective etching is performed to form an island-shaped oxide insulating layer 520.

A metal conductive film is formed over the island-shaped oxide insulating layer 520, the island-shaped first oxide semiconductor layer 504a, and the island-shaped second oxide semiconductor layer 506a by a sputtering method or the like. Then, a photolithography step is performed, whereby a resist mask is formed and selective etching is performed to form a source electrode layer 508a and a drain electrode layer 508b.

Then, an interlayer insulating layer 516 containing hydrogen is formed over the island-shaped oxide insulating layer 520, the source electrode layer 508a, and the drain electrode layer 508b, and then fourth heat treatment is performed. The conditions of the fourth heat treatment are the same as those of the fourth heat treatment described in Embodiment 2, and hydrogen is supplied to the first oxide semiconductor layer and the second oxide semiconductor layer to reduce vacancies in the first oxide semiconductor layer and the second oxide semiconductor layer.

As described above, the second oxide semiconductor layer 506a is formed by crystal growth from the crystal region in the first oxide semiconductor layer 504a and hydrogen contained in the interlayer insulating layer 516 is diffused to terminate defects. Thus, a channel-protective transistor 550 is completed.

Then, an interlayer insulating layer 518 for planarization is formed over the interlayer insulating layer 516. A cross-sectional structure described in FIG. 6 can be thus obtained.

This embodiment can be implemented in appropriate combination with any structure described in the other embodiments.

Embodiment 4

In this embodiment, as an example of a semiconductor integrated circuit including the semiconductor device described in any of the above embodiments, a semiconductor device having a stacked structure also including a semiconductor device using another semiconductor material will be described with reference to FIG. 7.

Figure 7:
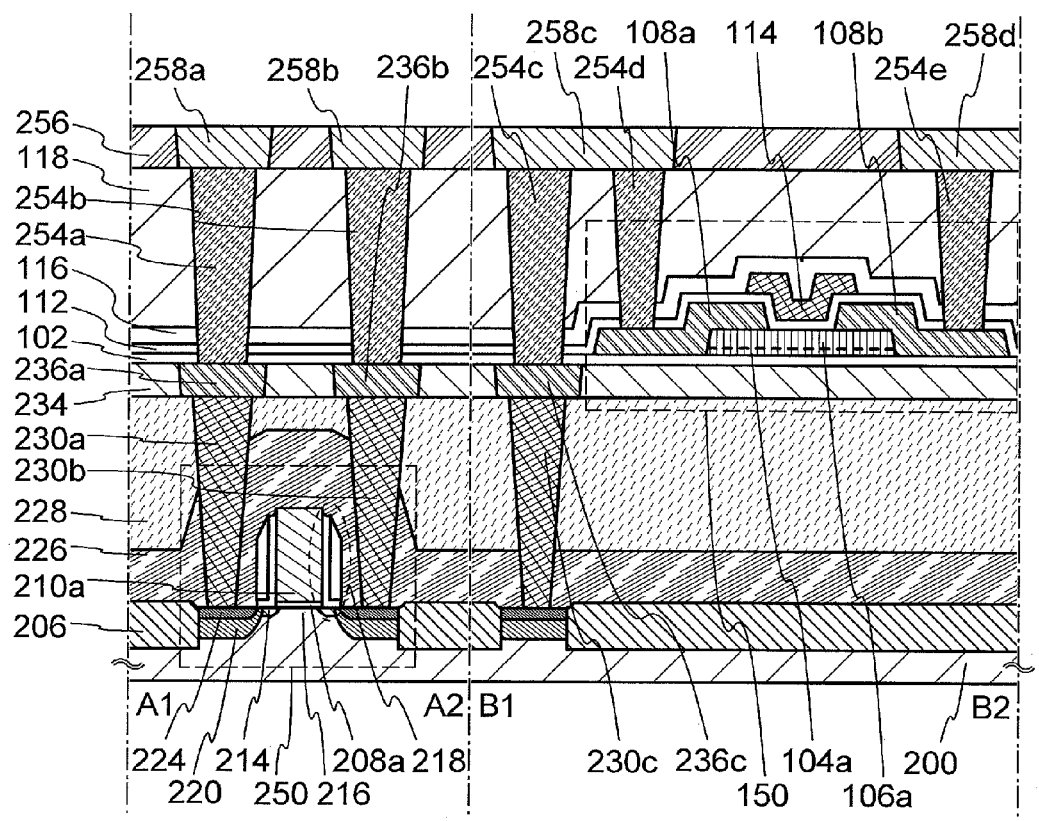
FIG. 7 is a cross-sectional view of one embodiment of the present invention.

FIG. 7 is a cross-sectional view illustrating an example of a structure of a semiconductor device according to this embodiment. The semiconductor device illustrated in FIG. 7 includes a transistor 250 including a material which is not an oxide semiconductor (e.g., silicon) in the lower portion and the transistor 150 including an oxide semiconductor in the upper portion. The transistor 150 including an oxide semiconductor is the transistor 150 illustrated in FIG. 1. Although the transistors 250 and 150 are n-channel transistors here, p-channel transistors may be used. In particular, it is easy to use a p-channel transistor as the transistor 250.

The transistor 250 includes a channel formation region 216 which is provided in a substrate 200 containing a semiconductor material, impurity regions 214 and high-concentration impurity regions 220 (which are also collectively called impurity regions) between which the channel formation region 216 is sandwiched, a gate insulating layer 208a provided over the channel formation region 216, a gate electrode layer 210a provided over the gate insulating layer 208a, and a source or drain electrode layer 230a and a source or drain electrode layer 230b which are electrically connected to the impurity regions 214 (see FIG. 7).

Here, a sidewall insulating layer 218 is provided on a side surface of the gate electrode layer 210a. In addition, the high-concentration impurity regions 220 are provided in regions of the substrate 200 which do not overlap with the sidewall insulating layer 218 when seen in a direction perpendicular to a main surface of the substrate 200, and metal compound regions 224 are provided in contact with the high-concentration impurity regions 220. An element isolation insulating layer 206 is provided over the substrate 200 so as to surround the transistor 250. An interlayer insulating layer 226 and an interlayer insulating layer 228 are provided so as to cover the transistor 250. The source or drain electrode layer 230a and the source or drain electrode layer 230b are electrically connected to the metal compound regions 224 through openings formed in the interlayer insulating layers 226 and 228. In other words, the source or drain electrode layer 230a and the source or drain electrode layer 230b are electrically connected to the high-concentration impurity regions 220 and the impurity regions 214 through the metal compound regions 224.

The transistor 150 includes the first oxide semiconductor layer 104a and the second oxide semiconductor layer 106a which are provided over the insulating layer 102; the source electrode layer 108a and the drain electrode layer 108b which are provided over the first oxide semiconductor layer 104a and the second oxide semiconductor layer 106a and are electrically connected to the first oxide semiconductor layer 104a and the second oxide semiconductor layer 106a; the gate insulating layer 112 provided so as to cover the first oxide semiconductor layer 104a, the second oxide semiconductor layer 106a, the source electrode layer 108a, and the drain electrode layer 108b; and the gate electrode layer 114 provided over the gate insulating layer 112 in a region overlapping with the second oxide semiconductor layer 106a (see FIG. 7).

In addition, the interlayer insulating layer 116 and the interlayer insulating layer 118 are provided over the transistor 150. Here, openings reaching the source electrode layer 108a and the drain electrode layer 108b are provided in the gate insulating layer 112, the interlayer insulating layer 116, and the interlayer insulating layer 118. Through the openings, an electrode 254d and an electrode 254e are formed in contact with the source electrode layer 108a and the drain electrode layer 108b, respectively. Similar to the electrodes 254d and 254e, an electrode 254a, an electrode 254b, and an electrode 254c are formed in contact with an electrode 236a, an electrode 236b, and an electrode 236c, respectively, through openings provided in the gate insulating layer 112, the interlayer insulating layer 116, and the interlayer insulating layer 118.

An insulating layer 256 is provided over the interlayer insulating layer 118. An electrode 258a, an electrode 258b, an electrode 258c, and an electrode 258d are provided so as to be embedded in the insulating layer 256. Here, the electrode 258a is in contact with the electrode 254a; the electrode 258b is in contact with the electrode 254b; the electrode 258c is in contact with the electrode 254c and the electrode 254d; and the electrode 258d is in contact with the electrode 254e.

In other words, the source electrode layer 108a or the drain electrode layer 108b of the transistor 150 is electrically connected to another element (such as the transistor including a material which is not an oxide semiconductor) via an electrode 230c, the electrode 236c, the electrode 254c, the electrode 258c, and the electrode 254d (see FIG. 7). In addition, the source electrode layer 108a or the drain electrode layer 108b of the transistor 150 is electrically connected to another element via the electrode 254e and the electrode 258d. Note that the structure of connection electrodes (such as the electrode 230c, the electrode 236c, the electrode 254c, the electrode 258c, and the electrode 254d) is not limited to the above structure, and appropriate addition, omission, or the like is possible.

Note that for part of the electrodes (e.g., the electrode 258a, the electrode 258b, the electrode 258c, and the electrode 258d); a material containing copper is preferably used. When a material containing copper is used for part of the electrodes, conductivity can be improved. An electrode or wiring containing copper can be formed by a so-called damascene process or the like.

As described above, in this embodiment, a typical example of the semiconductor device having a stacked structure is described; however, one embodiment of the present invention is not limited thereto. For example, a structure of a transistor, the number of insulating layers and arrangement thereof, the number of electrodes and wirings and a connection relation therebetween, and the like can be changed as appropriate. As an example of a connection relation between electrodes, a structure can be employed in which the gate electrode layer 210a of the transistor 250 and the source electrode layer 108a or the drain electrode layer 108b of the transistor 150 are electrically connected to each other.

As described above, a semiconductor device which has electrical characteristics different from those of a transistor including an oxide semiconductor can be realized by a combination of a transistor including a material which is not an oxide semiconductor and a transistor including an oxide semiconductor.

The structures, methods, and the like described in this embodiment can be combined as appropriate with any of the structures, methods, and the like described in the other embodiments.

Embodiment 5

In this embodiment, an example of a structure of a semiconductor device which functions as a memory device is described as a specific example of a semiconductor device according to one embodiment of the present invention. Note that a semiconductor device including a transistor including an oxide semiconductor and a transistor including a material which is not an oxide semiconductor (e.g., silicon) is described here.

Figure 8:
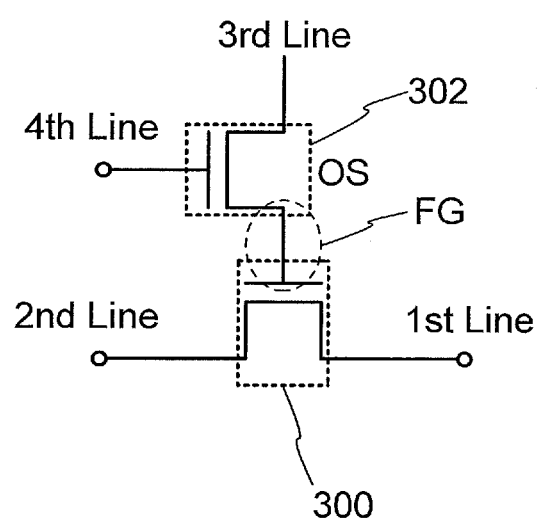
FIG. 8 is an equivalent circuit diagram of one embodiment of the present invention.

In the semiconductor device in FIG. 8, a gate electrode of a transistor 300 and one of a source electrode and a drain electrode of a transistor 302 are electrically connected to each other. A first wiring (a 1st line, also referred to as a source line) is electrically connected to a source electrode of the transistor 300. A second wiring (a 2nd line, also referred to as a bit line) is electrically connected to a drain electrode of the transistor 300. A third wiring (a 3rd line, also referred to as a first signal line) is electrically connected to the other of the source electrode and the drain electrode of the transistor 302. A fourth wiring (a 4th line, also referred to as a second signal line) is electrically connected to a gate electrode of the transistor 302. Here, a material which is not an oxide semiconductor (e.g., silicon) is used in the transistor 300 and an oxide semiconductor material is used in the transistor 302.

Since the transistor 300 including a material which is not an oxide semiconductor can operate at sufficiently high speed, stored data can be read at high speed by using the transistor 300. Moreover, the transistor 302 including an oxide semiconductor has extremely low off-state current. For that reason, a potential of the gate electrode of the transistor 300 can be held for an extremely long time when the transistor 302 is in an off state.

The source electrode or the drain electrode of the transistor 302 is electrically connected to the gate electrode of the transistor 300, thereby having an effect similar to a floating gate of a floating gate transistor in a nonvolatile memory element. Therefore, in this embodiment, a portion where the source electrode or the drain electrode of the transistor 302 is electrically connected to the gate electrode of the transistor 300 is called a floating gate portion FG The floating gate portion FG is embedded in an insulator and thus can store electric charge. The off-state current of the transistor 302 is equal to or less than $1/100000$ of that of the transistor 300 formed using a silicon semiconductor and thus loss of electric charge stored in the floating gate portion FG due to leakage of the transistor 302 can be negligible.

With such a structure, deterioration of a gate insulating film (a tunnel insulating film), which has been a problem of a conventional floating gate transistor, can be avoided. That is, this structure can solve a problem in that a gate insulating film deteriorates due to tunneling current generated when electrons are injected into a floating gate. For that reason, there is theoretically no limitation on the number of writings in the semiconductor devices illustrated in FIG. 8.

Note that a capacitor may be added to the floating gate portion FG. Addition of a capacitor to the floating gate portion FG facilitates holding of charge and suppressing of a potential change of the floating gate portion FG due to a potential change of wirings.

The semiconductor device in FIG. 8 utilizes the advantage that the potential of the gate electrode of the transistor 300 can be held and thereby can write, hold, and read data as described below.

First, writing and holding of data will be described. First, a potential of the fourth wiring is set to a potential at which the transistor 302 is in an on state, and the transistor 302 is turned on. Thus, a potential of the third wiring is supplied to the gate electrode of the transistor 300 (writing). After that, the potential of the fourth wiring is set to a potential at which the transistor 302 is in an off state, and the transistor 302 is turned off, whereby the potential of the gate electrode of the transistor 300 is held (holding).

Since the off-state current of the transistor 302 is extremely low, the potential of the gate electrode of the transistor 300 is held for a long time. For example, when the potential of the gate electrode of the transistor 300 is a potential at which the transistor 300 is in an on state, the on state of the transistor 300 is kept for a long time. When the potential of the gate electrode of the transistor 300 is a potential at which the transistor 300 is in an off state, the off state of the transistor 300 is kept for a long time.

Secondly, reading of data will be described. When a predetermined potential (a low potential) is supplied to the first wiring in a state where the on state or the off state of the transistor 300 is kept as described above, a potential of the second wiring changes depending on the on state or the off state of the transistor 300. For example, when the transistor 300 is in an on state, the potential of the second wiring becomes lower than the potential of the first wiring. In contrast, when the transistor 300 is in an off state, the potential of the second wiring is not changed.

In such a manner, the potential of the first wiring and the potential of the second wiring are compared with each other in a state where data is held, whereby the data can be read out.

Thirdly, rewriting of data will be described. Rewriting of data is performed in a manner similar to that of the writing and holding of data. In other words, the potential of the fourth wiring is set to a potential at which the transistor 302 is in an on state, and the transistor 302 is turned on. Thus, the potential of the third wiring (a potential for new data) is supplied to the gate electrode of the transistor 300. After that, the potential of the fourth wiring is set to a potential at which the transistor 302 is in an off state, and the transistor 302 is turned off, whereby the new data is held.

In the semiconductor device according to one embodiment of the present invention, data can be directly rewritten by another writing of data as described above. For that reason, erasing operation which is necessary in a flash memory and the like is not needed, whereby a reduction in operation speed due to erasing operation can be prevented. In other words, high-speed operation of the semiconductor device can be realized.

The semiconductor device according to this embodiment can store data for an extremely long time because the transistor 302 has low off-state current. In other words, refresh operation which is necessary in a DRAM and the like is not needed, whereby power consumption can be suppressed. Moreover, the semiconductor device according to this embodiment can be substantially used as a non-volatile semiconductor device.

Further, since data writing or the like is performed by switching operation of the transistor 302, high voltage is not necessary and deterioration of the element does not occur. Furthermore, data is written and erased by the transistor turning on and off, whereby high-speed operation can be easily realized.

Since a transistor including a material which is not an oxide semiconductor can operate at sufficiently high speed, stored data can be read at high speed by the transistor including a material which is not an oxide semiconductor.

Note that while an n-type transistor (an n-channel transistor) in which electrons are majority carriers is used in the above description, it is needless to say that a p-type transistor in which holes are majority carriers can be used instead of the n-type transistor.

The semiconductor device according to this embodiment can be formed, for example, with a stacked structure of the transistors described in Embodiment 4. It is needless to say that the disclosed invention is not necessarily limited to a stacked structure of transistors. For example, the transistor 300 and the transistor 302 may be formed on the same surface. Further, since the semiconductor device according to this embodiment utilizes low off-state current of the transistor 302, there is no particular limitation on the transistor 300. For example, while the transistor 300 is formed using a material which is not an oxide semiconductor in this embodiment, the transistor 300 may be formed using an oxide semiconductor.

In this embodiment, the semiconductor device with a minimum unit is described for simplification, but the structure of the semiconductor device is not limited thereto. A more advanced semiconductor device can be formed by connecting a plurality of semiconductor devices as appropriate. For example, a NAND-type or NOR-type semiconductor device can be formed by using a plurality of the above semiconductor devices. The structure of the wirings is not limited to that illustrated in FIG. 8 and can be changed as appropriate.

The structures, methods, and the like described in this embodiment can be combined as appropriate with any of the structures, methods, and the like described in the other embodiments.

Embodiment 6

In this embodiment, transistors including a c-axis-oriented oxide semiconductor layer are manufactured, and by using the transistors for a pixel portion, and further a driver circuit, a semiconductor device having a display function (also referred to as a display device) is manufactured. Further, some or all of the driver circuits can be formed over the same substrate as the pixel portion to provide a system-on-panel.

Figure 9A:
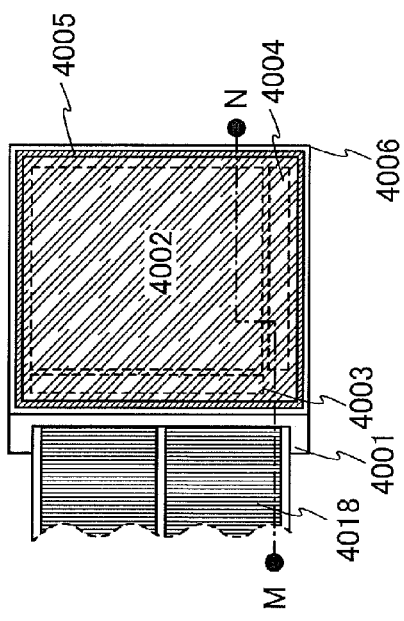
FIGS. 9A and 9B are respectively a top view and a cross-sectional view of one embodiment of the present invention.
Figure 9B:
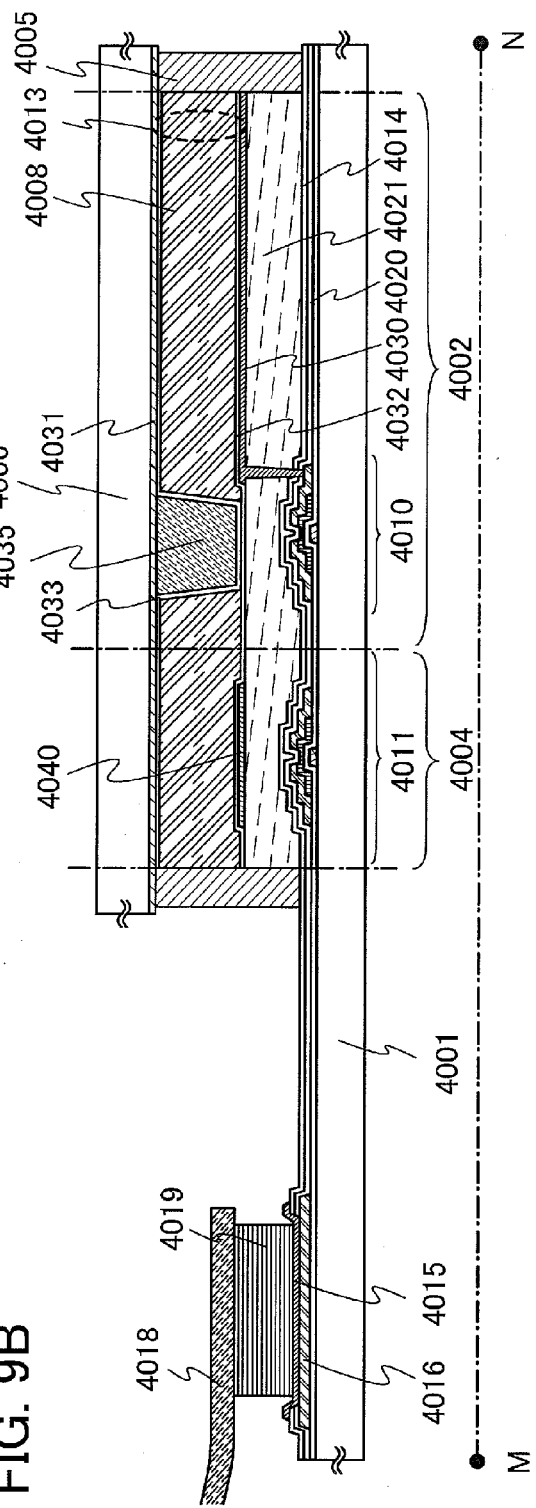

In this embodiment, an example of a liquid crystal display device will be described as a semiconductor device which is one embodiment of the present invention. First, an appearance and a cross section of a liquid crystal display panel, which is one embodiment of a semiconductor device, will be described with reference to FIGS. 9A and 9B. FIG. 9A is a top view of a panel in which transistors 4010 and 4011 including a c-axis-oriented oxide semiconductor layer and a liquid crystal element 4013, which are formed over a first substrate 4001, are sealed between the first substrate 4001 and a second substrate 4006 with a sealant 4005. FIG. 9B is a cross-sectional view taken along line M-N of FIG. 9A.

The sealant 4005 is provided so as to surround a pixel portion 4002, a signal line driver circuit 4003, and a scan line driver circuit 4004 which are provided over the first substrate 4001. The second substrate 4006 is provided over the pixel portion 4002, the signal line driver circuit 4003, and the scan line driver circuit 4004. Consequently, the pixel portion 4002, the signal line driver circuit 4003, and the scan line driver circuit 4004 are sealed together with a liquid crystal layer 4008, by the first substrate 4001, the sealant 4005, and the second substrate 4006.

The pixel portion 4002, the signal line driver circuit 4003, and the scan line driver circuit 4004 provided over the first substrate 4001 include a plurality of transistors. FIG. 9B illustrates the transistor 4010 included in the pixel portion 4002 and the transistor 4011 included in the scan line driver circuit 4004, as an example. Insulating layers 4020, 4014 and 4021 are provided over the transistors 4010 and 4011.

For the transistors 4010 and 4011, the transistor including a c-axis-oriented oxide semiconductor layer in Embodiment 2 can be used. In this embodiment, the transistors 4010 and 4011 are n-channel transistors.

A conductive layer 4040 is provided over a part of the insulating layer 4021 which overlaps with a channel formation region in the oxide semiconductor layer in the transistor 4011 for the driver circuit. The conductive layer 4040 is provided so as to overlap with the channel formation region of the oxide semiconductor layer, whereby the amount of change in threshold voltage of the transistor 4011 between before and after the BT test can be reduced. A potential of the conductive layer 4040 may be the same or different from that of a gate electrode layer of the transistor 4011. The conductive layer 4040 can also serve as a second gate electrode layer. Alternatively, the potential of the conductive layer 4040 may be GND or 0 V, or the conductive layer 4040 may be in a floating state.

A pixel electrode layer 4030 included in the liquid crystal element 4013 is electrically connected to the transistor 4010. A counter electrode layer 4031 of the liquid crystal element 4013 is provided on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033 serving as alignment films, respectively, and the liquid crystal layer 4008 is sandwiched between the insulating layers 4032 and 4033 which are provided between the liquid crystal layer 4008 and the pixel electrode layer 4030, and between the liquid crystal layer 4008 and the counter electrode layer 4031, respectively.

Note that glass or plastics can be used as the second substrate 4006.

Reference numeral 4035 denotes a columnar spacer which is obtained by selective etching of an insulating layer and provided in order to control the distance (a cell gap) between the pixel electrode layer 4030 and the counter electrode layer 4031. Alternatively, a spherical spacer may be used. The counter electrode layer 4031 is electrically connected to a common potential line formed over the insulating substrate where the transistor 4010 is formed. In addition, using the common connection portion, the counter electrode layer 4031 and the common potential line can be electrically connected to each other via conductive particles provided between the pair of substrates. Note that the conductive particles are included in the sealant 4005.

Alternatively, liquid crystal exhibiting a blue phase for which an alignment film is unnecessary may be used. A blue phase is one of the liquid crystal phases, which is generated just before a cholesteric phase changes into an isotropic phase while the temperature of cholesteric liquid crystal is increased. Since the blue phase is generated within an only narrow range of temperature, a liquid crystal composition containing a chiral agent at 5 wt % or more is used for the liquid crystal layer 4008 in order to improve the temperature range. The liquid crystal composition including liquid crystal exhibiting a blue phase and a chiral agent has a short response time of 1 msec or less and is optically isotropic; therefore, alignment treatment is not necessary and viewing angle dependence is small.

When liquid crystal exhibiting a blue phase is used, rubbing treatment on an alignment film is unnecessary; accordingly, electrostatic discharge damage caused by the rubbing treatment can be prevented and defects and damage of the liquid crystal display device in the manufacturing process can be reduced. Thus, productivity of the liquid crystal display device can be increased. A transistor which includes an oxide semiconductor layer particularly has a possibility that electrical characteristics of the transistor may change significantly by influence of static electricity and deviate from the designed range. Therefore, it is more effective to use a blue phase liquid crystal material for a liquid crystal display device including a transistor which includes an oxide semiconductor layer. Note that in the case where a blue phase is used, an embodiment of the present invention is not limited to the structure in FIGS. 9A and 9B, and a structure of a so-called horizontal electric field mode may be employed, in which an electrode layer corresponding to the counter electrode layer 4031 is formed on the same substrate side as the pixel electrode layer 4030.

Although a transmissive liquid crystal display device is described in this embodiment, an embodiment of the present invention can also be applied to a reflective liquid crystal display device or a transflective liquid crystal display device.

Although a polarizing plate is provided on the outer surface of the substrate (on the viewer side) and a coloring layer and an electrode layer used for a display element are provided in the order from the inner surface of the substrate in the example of the liquid crystal display device in this embodiment, the polarizing plate may be provided on the inner surface of the substrate. The stacked-layer structure of the polarizing plate and the coloring layer is not limited to the structure in this embodiment and may be set as appropriate depending on materials of the polarizing plate and the coloring layer or conditions of the manufacturing process. Furthermore, a light-blocking layer serving as a black matrix may be provided as needed.

In this embodiment, in order to reduce surface unevenness of the transistors and to improve reliability of the transistors, the transistors are covered with a protective layer or the insulating layers (the insulating layer 4020, an insulating layer 4014, and the insulating layer 4021) which serve as planarizing insulating layers. Note that the protective layer is provided to prevent entry of contaminant impurities such as an organic substance, a metal substance, or moisture floating in air and is preferably a dense film. The protective layer may be formed by a sputtering method to have a single-layer structure or a stacked-layer structure including any of a silicon oxide layer, a silicon nitride layer, a silicon oxynitride layer, a silicon nitride oxide layer, an aluminum oxide layer, an aluminum nitride layer, an aluminum oxynitride layer, and an aluminum nitride oxide layer.

Here, an insulating layer having a stacked structure is formed as the protective layer. For example, as the insulating layer 4020 which is a first layer, a silicon oxide layer is formed by a sputtering method. When a silicon oxide layer is used as a protective layer, oxygen is added to the oxide semiconductor layer that is in contact with the protective layer, whereby oxygen vacancies can be reduced.

Here, as the second layer of the insulating layer 4014, a silicon nitride layer which is one of nitride insulating layers containing hydrogen is formed by a plasma CVD method, and then heat treatment is performed so that hydrogen is diffused into the oxide semiconductor layer. The use of the silicon nitride layer as the protective layer can prevent ions such as sodium ions from entering a semiconductor region, whereby variations in electrical characteristics of the transistors can be suppressed.

The insulating layer 4021 is formed as the planarizing insulating layer. As the insulating layer 4021, an organic material such as acrylic can be used. As an alternative to such an organic material, it is possible to use a low-dielectric constant material (a low-k material), a siloxane-based resin, phosphosilicate glass (PSG), borophosphosilicate glass (BPSG), or the like. Note that the insulating layer 4021 may be formed by stacking a plurality of insulating layers formed of these materials.

The pixel electrode layer 4030 and the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

Further, a variety of signals and potentials are supplied via an FPC 4018 to the signal line driver circuit 4003, the scan line driver circuit 4004, or the pixel portion 4002, which are formed over the same substrate.

In this embodiment, a connection terminal electrode 4015 is formed using the same conductive layer as the pixel electrode layer 4030 included in the liquid crystal element 4013. A terminal electrode 4016 is formed using the same conductive layer as the source and drain electrode layers included in the transistors 4010 and 4011.

The connection terminal electrode 4015 is electrically connected to a terminal included in the FPC 4018 via an anisotropic conductive layer 4019.

In addition, if needed, a color filter is provided for each pixel. Furthermore, a polarizing plate or a diffusing plate is provided on the outer side of the first substrate 4001 and the second substrate 4006. A light source of a backlight includes a cold-cathode tube or an LED. Thus, a liquid crystal display module is obtained.

For the liquid crystal display module, a twisted nematic (TN) mode, an in-plane-switching (IPS) mode, a fringe field switching (FFS) mode, a multi-domain vertical alignment (MVA) mode, a patterned vertical alignment (PVA) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

Through the above process, a liquid crystal display device can be manufactured.

The transistor including a c-axis-oriented oxide semiconductor layer described in Embodiment 2 includes an oxide semiconductor layer with excellent crystallinity and has high field-effect mobility. When a liquid crystal display device is manufactured using such a transistor as in this embodiment, a liquid crystal display device having excellent display characteristics is realized.

This embodiment can be implemented in appropriate combination with any structure described in the other embodiments.

Embodiment 7

Figure 10A:
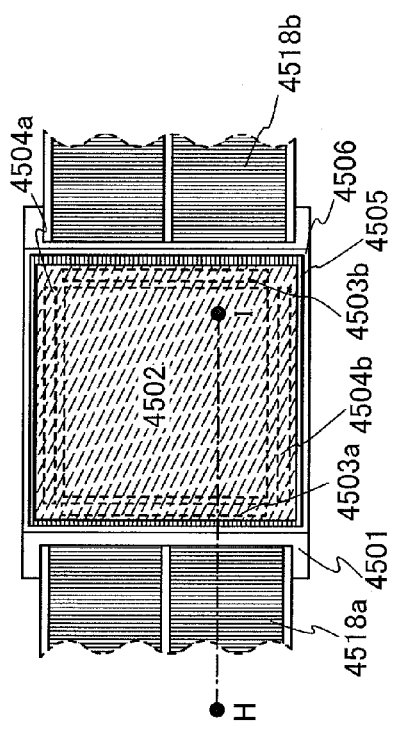
FIGS. 10A and 10B are respectively a top view and a cross-sectional view of one embodiment of the present invention.
Figure 10B:
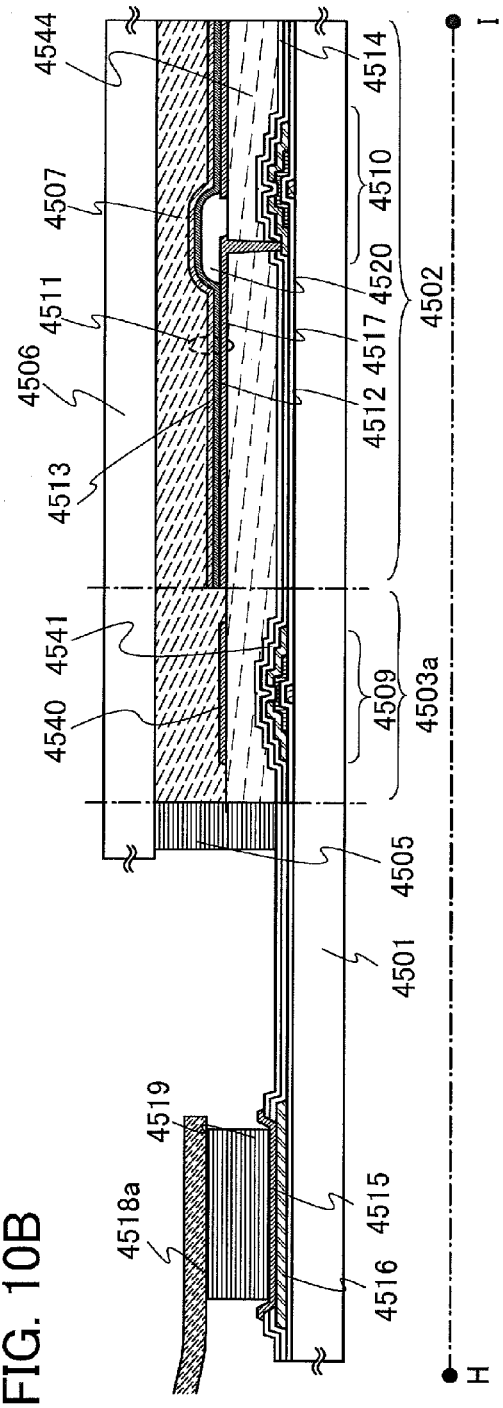

An appearance and a cross section of a light-emitting display panel (also referred to as a light-emitting panel), which is one embodiment of a semiconductor device, will be described with reference to FIGS. 10A and 10B. FIG. 10A is a plan view of a panel in which a transistor including a c-axis-oriented oxide semiconductor layer and a light-emitting element which are formed over a first substrate are sealed between the first substrate and a second substrate with a sealant. FIG. 10B is a cross-sectional view taken along line H-I of FIG. 10A.

The sealant 4505 is provided so as to surround a pixel portion 4502, signal line driver circuits 4503a and 4503b, and scan line driver circuits 4504a and 4504b which are provided over a first substrate 4501. A second substrate 4506 is provided over the pixel portion 4502, the signal line driver circuits 4503a and 4503b, and the scan line driver circuits 4504a and 4504b. Consequently, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. It is preferable that a panel be thus packaged (sealed) with a protective film or a cover material with high air-tightness and little degasification so that the pixel portion 4502, the signal line driver circuits 4503a and 4503b, the scan line driver circuits 4504a and 4504b are not exposed to air.

The pixel portion 4502, the signal line driver circuit 4503a and 4503b, and the scan line driver circuit 4504a and 4504b which are provided over the first substrate 4501 include a plurality of transistors. FIG. 10B illustrates a transistor 4510 included in the pixel portion 4502 and a transistor 4509 included in the signal line driver circuit 4503a, as an example.

For the transistors 4509 and 4510, the transistor with high mobility including a c-axis-oriented oxide semiconductor layer in Embodiment 2 can be used. In this embodiment, the transistors 4509 and 4510 are n-channel transistors.

A conductive layer 4540 is provided over part of the insulating layer 4544 and overlaps with a channel formation region in an oxide semiconductor layer in the transistor 4509 for the driver circuit. A potential of the conductive layer 4540 may be the same or different from that of a gate electrode layer of the transistor 4509. The conductive layer 4540 can also serve as a second gate electrode layer. Alternatively, the potential of the conductive layer 4540 may be GND or 0 V, or the conductive layer 4540 may be in a floating state.

In the transistor 4509, an insulating layer 4541 is formed as a protective insulating layer in contact with the semiconductor layer including the channel formation region. The insulating layer 4541 may be formed using a material and a method which are similar to those of the oxide insulating layer 412 described in Embodiment 2. Further, a protective insulating layer 4514 is formed over the insulating layer 4541. The protective insulating layer 4514 may be formed using a material and a method which are similar to those of the interlayer insulating layer 416 described in Embodiment 2. Here, a silicon nitride layer is formed by a PCVD method as the protective insulating layer 4514.

Further, an insulating layer 4544 serving as a planarization insulating layer which reduces surface roughness of the transistor is formed over the protective insulating layer 4514. The insulating layer 4544 may be formed using a material and a method which are similar to those of the insulating layer 4021 described in Embodiment 6. Here, acrylic is used for the insulating layer 4544.

Moreover, reference numeral 4511 denotes a light-emitting element. A first electrode layer 4517 which is a pixel electrode included in the light-emitting element 4511 is electrically connected to a source or drain electrode layer of the transistor 4510. Note that although the light-emitting element 4511 has a stacked-layer structure including the first electrode layer 4517, an electroluminescent layer 4512, and a second electrode layer 4513, the structure of the light-emitting element 4511 is not limited thereto. The structure of the light-emitting element 4511 can be changed as appropriate depending on, for example, the direction in which light is extracted from the light-emitting element 4511.

The partition 4520 is formed using an organic resin layer or an inorganic insulating layer. It is particularly preferable that the partition be formed using a photosensitive material, an opening be formed over the first electrode layer 4517, and a sidewall of the opening have an inclined side surface with a continuous curvature.

The electroluminescent layer 4512 may be formed using either a single layer or a stack of plural layers.

In order to prevent entry of oxygen, hydrogen, moisture, carbon dioxide, or the like into the light-emitting element 4511, a protective layer may be formed over the second electrode layer 4513 and the partition 4520. As the protective layer, a silicon nitride layer, a silicon nitride oxide layer, a DLC layer, or the like can be formed.

In addition, a variety of signals and potentials are supplied to the signal line driver circuits 4503a and 4503b, the scan line driver circuits 4504a and 4504b, or the pixel portion 4502 via FPCs 4518a and 4518b.

A connection terminal electrode 4515 is formed using the same conductive layer as the first electrode layer 4517 included in the light-emitting element 4511. A terminal electrode 4516 is formed using the same conductive layer as a source and drain electrode layers included in the transistors 4509 and 4510.

The connection terminal electrode 4515 is electrically connected to a terminal included in the FPC 4518a via an anisotropic conductive layer 4519.

The second substrate which is located in the direction in which light is extracted from the light-emitting element 4511 needs to have a light-transmitting property. In that case, a light-transmitting material such as a glass plate, a plastic plate, a polyester film, or an acrylic resin film is used.

As the filler 4507, in addition to an inert gas such as nitrogen or argon, an ultraviolet curable resin or a thermosetting resin can be used, and acrylic, an epoxy resin, or the like can be used. For example, nitrogen may be used as the filler.

In addition, if needed, an optical film such as a polarizing plate, a circularly polarizing plate (including an elliptically polarizing plate), a retardation plate (a quarter-wave plate or a half-wave plate), or a color filter may be provided as appropriate on an emission surface of the light-emitting element.

Through the above process, a light-emitting display device (a display panel) liquid can be manufactured.

The transistor including a c-axis-oriented oxide semiconductor layer described in Embodiment 2 includes an oxide semiconductor layer with excellent crystallinity and has high field-effect mobility. When a light-emitting display device is manufactured using such a transistor as in this embodiment, a light-emitting display device having excellent display characteristics is realized.

This embodiment can be implemented in appropriate combination with any structure described in the other embodiments.

Embodiment 8

In this embodiment, an electronic paper will be described as an example of a semiconductor device.

A transistor including a c-axis-oriented oxide semiconductor layer obtained by the method described in Embodiments 1 to 3 may be used for an electronic paper in which electronic ink is driven by an element electrically connected to a switching element. The electronic paper is also referred to as an electrophoretic display device (an electrophoretic display) and is advantageous in that it has the same level of readability as plain paper, it has lower power consumption than other display devices, and it can be made thin and lightweight.

Electrophoretic displays can have various modes. For example, electrophoretic displays contain a plurality of microcapsules dispersed in a solvent or a solute, and each microcapsule contains first particles which are positively charged and second particles which are negatively charged. By application of an electric field to the microcapsules, the particles in the microcapsules move in opposite directions to each other and only the color of the particles gathering on one side is displayed. Note that the first particles or the second particles each include a pigment, and do not move without an electric field. The first particles and the second particles have different colors (which may be colorless).

Thus, an electrophoretic display utilizes a so-called dielectrophoretic effect by which a substance with high dielectric constant moves to a region with a high electric field.

A solution in which the above microcapsules are dispersed in a solvent is referred to as electronic ink. Electronic ink can be printed on a surface of glass, plastic, fabric, paper, or the like. Furthermore, by use of a color filter or particles that have a pigment, color display can also be achieved.

In addition, if a plurality of the above microcapsules are arranged as appropriate over an active matrix substrate so as to be interposed between two electrodes, an active matrix display device can be completed, and images can be displayed by application of an electric field to the microcapsules. For example, an active matrix substrate which is formed using the transistors including a c-axis-oriented oxide semiconductor layer described in Embodiment 2 can be used.

Note that the first particles and the second particles in the microcapsules can be formed from any one of a conductive material, an insulating material, a semiconductor material, a magnetic material, a liquid crystal material, a ferroelectric material, an electroluminescent material, an electrochromic material, and a magnetophoretic material, or formed from a composite material thereof.

Figure 11:
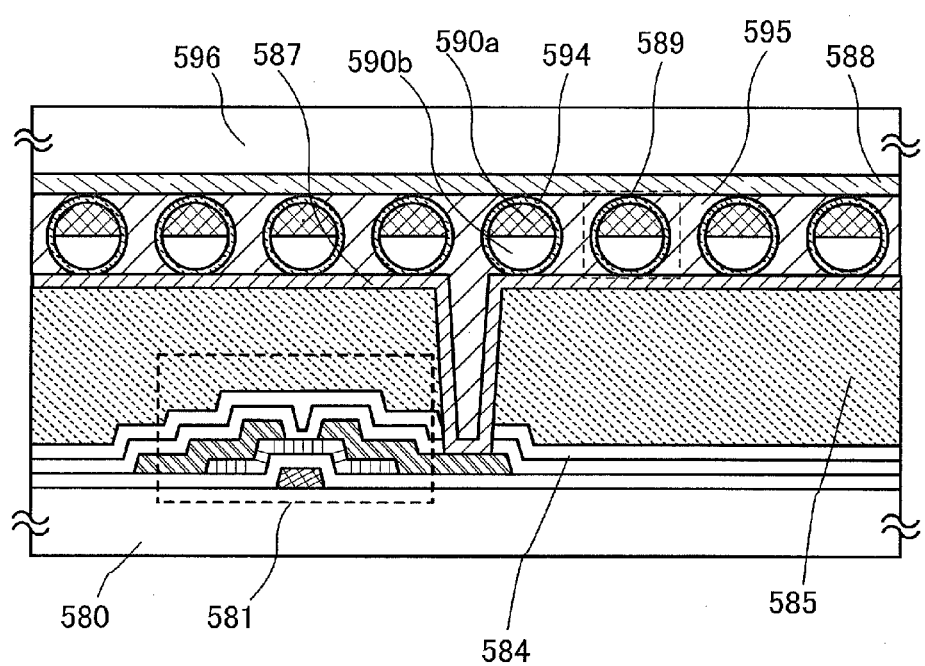
FIG. 11 is a cross-sectional view of one embodiment of the present invention.

FIG. 11 illustrates an active matrix electronic paper as an example of a semiconductor device. A transistor 581 in the semiconductor device can be manufactured in a manner similar to that of the transistor described in Embodiment 2 and is a transistor with high mobility including a c-axis-oriented oxide semiconductor layer. In addition, an insulating layer 584 is a nitride insulating layer containing hydrogen and is provided for supplying hydrogen to the c-axis-oriented oxide semiconductor layer.

The electronic paper of FIG. 11 is an example of a display device in which a twisting ball display system is employed. The twisting ball display system refers to a method in which spherical particles each colored in black and white are arranged between a first electrode layer and a second electrode layer which are electrode layers used in a display element, and a potential difference is generated between the first electrode layer and the second electrode layer to control orientation of the spherical particles, so that display is performed.

The transistor 581 formed over a first substrate 580 is a bottom-gate transistor and a source or drain electrode layer thereof is in contact with a first electrode layer 587 through an opening formed in an insulating layer 585, whereby the transistor 581 is electrically connected to the first electrode layer 587. Between the first electrode layer 587 and a second electrode layer 588 which is provided on a second substrate 596, spherical particles 589 are provided. The spherical particles 589 are surrounded by filler 595 formed of a material such as a resin. A cavity 594 in the spherical particle 589 is filled with liquid and also includes a particle having a black region 590a and a white region 590b.

The first electrode layer 587 corresponds to a pixel electrode, and the second electrode layer 588 corresponds to a common electrode. The second electrode layer 588 is electrically connected to a common potential line provided over the same insulating substrate as the transistor 581. With the use of a common connection portion, the second electrode layer 588 can be electrically connected to the common potential line via conductive particles provided between the pair of substrates.

Further, instead of the twisting ball, an electrophoretic element can be used. A microcapsule having a diameter of about 10 μm to 200 μm in which transparent liquid, positively charged white microparticles, and negatively charged black microparticles are encapsulated is used. In the microcapsules which are provided between the first electrode layer and the second electrode layer, when an electric field is applied by the first electrode layer and the second electrode layer, the white microparticles and the black microparticles move to opposite sides from each other, so that white or black can be displayed. A display element using this principle is an electrophoretic display element and is called an electronic paper in general.

Through the above process, an electronic paper can be manufactured.

In this embodiment, with the use of the transistor including a c-axis-oriented oxide semiconductor layer described in Embodiment 2, a so-called electronic paper is manufactured. The transistor includes an oxide semiconductor layer with excellent crystallinity and has high field-effect mobility. When an electronic paper is manufactured using the transistor, an electronic paper having excellent display characteristics can be realized.

This embodiment can be implemented in appropriate combination with any structure described in the other embodiments.

Embodiment 9

The semiconductor device disclosed in this specification can be applied to a variety of electronic devices (including game machines). Examples of such electronic devices are a television device (also referred to as a television or a television receiver), a monitor of a computer or the like, a digital camera, a digital video camera, a digital photo frame, a mobile phone handset (also referred to as a mobile phone or a mobile phone device), a portable game console, a portable information terminal, an audio playback device, a large game machine such as a pinball machine, and the like.

In this embodiment, examples of an electronic device including a display device which can be obtained in any one of Embodiments 6 to 8 will be described with reference to FIGS. 12A to 12E and FIG. 13.

Figure 12A:
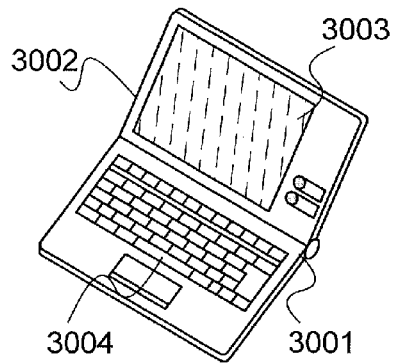
FIGS. 12A to 12E illustrate examples of electronic devices.

FIG. 12A illustrates a notebook personal computer which at least includes a display device as a component and also includes a main body 3001, a housing 3002, a display portion 3003, a keyboard 3004, and the like. Note that this notebook personal computer includes the liquid crystal display device described in Embodiment 6.

Figure 12D:
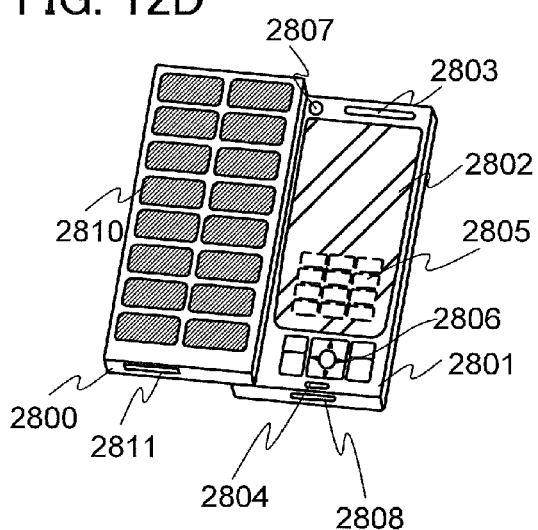
Figure 12B:
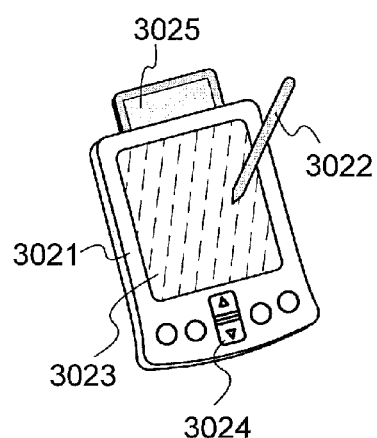

FIG. 12B illustrates a portable information terminal (a personal digital assistant, PDA) which at least includes a display device as a component. A main body 3021 is provided with a display portion 3023, an external interface 3025, an operation button 3024, and the like. In addition, a stylus 3022 is provided as an accessory for operation. Note that this portable information terminal device includes the light-emitting display device described in Embodiment 7.

Figure 12E:
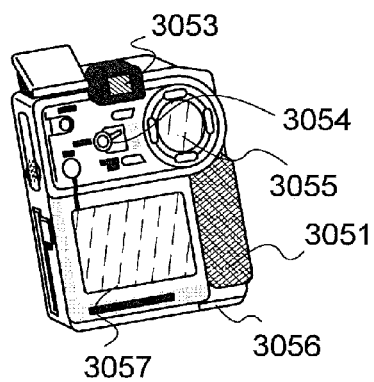
Figure 12C:
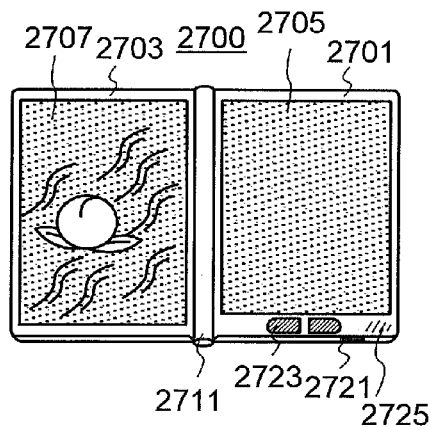

FIG. 12C is an e-book reader which includes the electronic paper described in Embodiment 8 as a component. FIG. 12C illustrates an example of an e-book reader. For example, the e-book reader 2700 includes two housings, a housing 2701 and a housing 2703. The housing 2701 and the housing 2703 are combined with a hinge 2711 so that the e-book reader 2700 can be opened and closed along the hinge 2711. With such a structure, the e-book reader 2700 can be handled like a paper book.

A display portion 2705 and a display portion 2707 are incorporated in the housing 2701 and the housing 2703, respectively. The display portion 2705 and the display portion 2707 may display one image or different images. In the structure where different images are displayed on the display portion 2705 and the display portion 2707, for example, the right display portion (the display portion 2705 in FIG. 12C) can display text and the left display portion (the display portion 2707 in FIG. 12C) can display images.

FIG. 12C illustrates an example in which the housing 2701 is provided with an operation portion and the like. For example, the housing 2701 is provided with a power switch 2721, operation keys 2723, a speaker 2725, and the like. Pages can be turned with the operation keys 2723. Note that a keyboard, a pointing device, and the like may be provided on the same surface as the display portion of the housing. Moreover, an external connection terminal (e.g., an earphone terminal or a USB terminal), a storage medium insertion portion, and the like may be provided on the back surface or the side surface of the housing. Moreover, the e-book reader 2700 may have a function of an electronic dictionary.

The e-book reader 2700 may be configured to wirelessly transmit and receive data. Through wireless communication, desired book data or the like can be purchased and downloaded from an e-book server.

FIG. 12D illustrates a mobile phone which includes at least a display device as a component and which includes two housings, a housing 2800 and a housing 2801. The housing 2801 includes a display panel 2802, a speaker 2803, a microphone 2804, a pointing device 2806, a camera 2807, an external connection terminal 2808, and the like. The housing 2800 is provided with a solar battery 2810 for charging of the mobile phone, an external memory slot 2811, and the like. In addition, an antenna is incorporated in the housing 2801.

Further, the display panel 2802 is provided with a touch screen. A plurality of operation keys 2805 which is displayed is indicated by dashed lines in FIG. 12D. Note that a booster circuit is mounted for boosting a voltage output from the solar battery 2810 to a voltage needed for each circuit.

In the display panel 2802, a display orientation can be changed as appropriate depending on a usage mode. Further, the camera 2807 is provided in the same plane as the display panel 2802, and thus the mobile phone can be used for videophone calls. The speaker 2803 and the microphone 2804 can be used for videophone calls, recording and playing sound, and the like without being limited to voice calls. Moreover, the housings 2800 and 2801 which are developed in FIG. 12D can be slid so that one is lapped over the other, and thus the size of the portable information terminal can be reduced, which makes the mobile phone suitable for being carried.

The external connection terminal 2808 can be connected to an AC adaptor and various types of cables such as a USB cable so that charging and data communication with a personal computer or the like are possible. Furthermore, a large amount of data can be stored and moved with a storage medium inserted into the external memory slot 2811.

In addition to the above functions, the mobile phone may have an infrared communication function, a television receiver function, and the like.

FIG. 12E illustrates a digital camera which includes at least a display device as a component and which includes a main body 3051, a display portion (A) 3057, an eyepiece 3053, an operation switch 3054, a display portion (B) 3055, a battery 3056, and the like.

Figure 13:
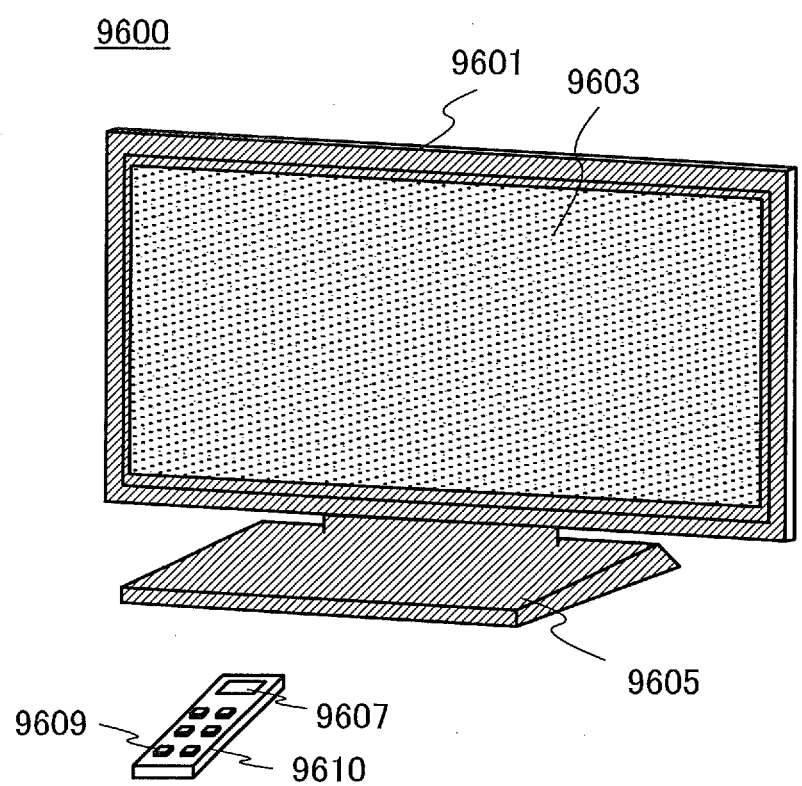
FIG. 13 illustrates an example of an electronic device.

FIG. 13 illustrates an example of a television set. In the television device 9600, a display portion 9603 is incorporated in a housing 9601. The display portion 9603 can display images. Here, the housing 9601 is supported by a stand 9605.

The television device 9600 can be operated with an operation switch of the housing 9601 or a separate remote control 9610. Channels can be switched and volume can be controlled with operation keys 9609 of the remote control 9610, whereby an image displayed on the display portion 9603 can be controlled. Moreover, the remote control 9610 may be provided with a display portion 9607 for displaying data output from the remote control 9610.

Note that the television device 9600 is provided with a receiver, a modem, and the like. With the receiver, general TV broadcasts can be received. Moreover, when the display device is connected to a communication network with or without wires via the modem, one-way (from a sender to a receiver) or two-way (e.g., between a sender and a receiver or between receivers) information communication can be performed.

In the display portion 9603, a plurality of transistors described in Embodiment 2 is provided as switching elements of pixels. In a driver circuit formed over the same insulating substrate as the display portion 9603, a transistor with high mobility which is described in Embodiment 2 is provided.

This embodiment can be implemented in appropriate combination with any structure described in the other embodiments.

This application is based on Japanese Patent Application serial no. 2009-288245 filed with Japan Patent Office on Dec. 18, 2009, the entire contents of which are hereby incorporated by reference.

The invention claimed is:

1. A method for manufacturing a semiconductor device, comprising:

forming a first oxide semiconductor layer;

performing first heat treatment on the first oxide semiconductor layer to form a crystal region which is grown from a surface toward an inside of the first oxide semiconductor layer, wherein the crystal region includes crystals whose c-axis is oriented in a direction substantially perpendicular to the surface of the first oxide semiconductor layer;

forming a second oxide semiconductor layer over the first oxide semiconductor layer including the crystal region;

performing second heat treatment on the first oxide semiconductor layer and the second oxide semiconductor layer in an atmosphere including oxygen at a constant temperature so as to form c-axis oriented crystals grown from the crystal region in the second oxide semiconductor layer and so as to supply oxygen to the first oxide semiconductor layer and the second oxide semiconductor layer;

forming a conductive layer over the second oxide semiconductor layer on which the second heat treatment is performed;

forming a source electrode layer and a drain electrode layer by selectively etching the conductive layer;

forming an oxide insulating layer to cover the source electrode layer, the drain electrode layer, and the second oxide semiconductor layer, wherein the oxide insulating layer is in contact with the second oxide semiconductor layer;

performing third heat treatment on the oxide insulating layer to supply oxygen to the second oxide semiconductor layer;

forming a gate electrode layer over the oxide insulating layer, the gate electrode layer overlapping with the second oxide semiconductor layer to which oxygen is supplied;

forming a nitride insulating layer including hydrogen over the gate electrode layer and the oxide insulating layer; and performing fourth heat treatment on the nitride insulating layer to terminate dangling bonds with hydrogen, the dangling bonds existing at least in the first oxide semiconductor layer and the second oxide semiconductor layer and at an interface between the second oxide semiconductor layer and the oxide insulating layer, wherein an oxygen concentration of the atmosphere is increased over heat treatment time in the second heat treatment.

2. The method for manufacturing a semiconductor device according to claim 1, wherein the first heat treatment is performed at a temperature greater than or equal to 400° C. and less than or equal to 800° C. in an atmosphere selected from nitrogen, a rare gas, oxygen, a mixed gas of oxygen and one of nitrogen and a rare gas, and dry air.

3. The method for manufacturing a semiconductor device according to claim 1, wherein the second heat treatment is performed at a temperature greater than or equal to 400° C. and less than or equal to 800° C. and in an atmosphere selected from nitrogen, a rare gas, oxygen, a mixed gas of oxygen and one of nitrogen and a rare gas, and dry air.

4. The method for manufacturing a semiconductor device according to claim 1, wherein the second heat treatment is finished in an atmosphere including oxygen.

5. The method for manufacturing a semiconductor device according to claim 1, wherein the third heat treatment is performed at a temperature greater than or equal to 200° C. and less than or equal to 450° C.

6. The method for manufacturing a semiconductor device according to claim 1, wherein the fourth heat treatment is performed at a temperature greater than or equal to 150° C. and less than or equal to 450° C.

7. A method for manufacturing a semiconductor device, comprising:

forming a gate electrode layer;

forming a first oxide insulating layer over the gate electrode layer;

forming a first oxide semiconductor layer over the gate electrode layer and the first oxide insulating layer;

performing first heat treatment on the first oxide semiconductor layer to form a crystal region which is grown from a surface toward an inside of the first oxide semiconductor layer, wherein the crystal region includes crystals whose c-axis is oriented in a direction substantially perpendicular to the surface of the first oxide semiconductor layer;

forming a second oxide semiconductor layer over the first oxide semiconductor layer including the crystal region;

performing second heat treatment on the first oxide semiconductor layer and the second oxide semiconductor layer in an atmosphere including oxygen at a constant temperature so as to form c-axis oriented crystals grown from the crystal region in the second oxide semiconductor layer and so as to supply oxygen to the first oxide semiconductor layer and the second oxide semiconductor layer;

forming a conductive layer over the second oxide semiconductor layer on which the second heat treatment is performed;

forming a source electrode layer and a drain electrode layer by selectively etching the conductive layer;

forming a second oxide insulating layer to cover the source electrode layer, the drain electrode layer, and the second oxide semiconductor layer, wherein the second oxide insulating layer is in contact with the second oxide semiconductor layer;

performing third heat treatment on the second oxide insulating layer to supply oxygen to the second oxide semiconductor layer;

forming a nitride insulating layer including hydrogen over the second oxide insulating layer on which the third heat treatment is performed; and performing fourth heat treatment on the nitride insulating layer to terminate dangling bonds with hydrogen, the dangling bonds existing at least in the first oxide semiconductor layer and the second oxide semiconductor layer and at interfaces between the first oxide insulating layer and the first oxide semiconductor layer and between the second oxide insulating layer and the second oxide semiconductor layer, wherein an oxygen concentration of the atmosphere is increased over heat treatment time in the second heat treatment.

8. The method for manufacturing a semiconductor device according to claim 7, wherein the first heat treatment is performed at a temperature greater than or equal to 400° C. and less than or equal to 800° C. in an atmosphere selected from nitrogen, a rare gas, oxygen, a mixed gas of oxygen and one of nitrogen and a rare gas, and dry air.

9. The method for manufacturing a semiconductor device according to claim 7, wherein the second heat treatment is performed at a temperature greater than or equal to 400° C. and less than or equal to 800° C. and in an atmosphere selected from nitrogen, a rare gas, oxygen, a mixed gas of oxygen and one of nitrogen and a rare gas, and dry air.

10. The method for manufacturing a semiconductor device according to claim 7, wherein the second heat treatment is finished in an atmosphere including oxygen.

11. The method for manufacturing a semiconductor device according to claim 7, wherein the third heat treatment is performed at a temperature greater than or equal to 200° C. and less than or equal to 450° C.

12. The method for manufacturing a semiconductor device according to claim 7, wherein the fourth heat treatment is performed at a temperature greater than or equal to 150° C. and less than or equal to 450° C.

13. A method for manufacturing a semiconductor device, comprising:
    forming a first oxide semiconductor layer;
    performing first heat treatment to form a crystal region which is grown from a surface of the first oxide semiconductor layer in the first oxide semiconductor layer;
    forming a second oxide semiconductor layer over the first oxide semiconductor layer including the crystal region;
    performing second heat treatment in an atmosphere including oxygen to form crystals grown form the crystal region in the second oxide semiconductor layer;
    after performing the second heat treatment, forming an interlayer insulating layer including hydrogen over the second oxide semiconductor layer; and
    performing third heat treatment on the interlayer insulating layer, wherein an oxygen concentration of the atmosphere is increased over heat treatment time in the second heat treatment.

14. The method for manufacturing a semiconductor device according to claim 13, further comprising:
    forming a gate electrode layer; and
    forming an oxide insulating layer over the gate electrode layer,
    wherein the first oxide semiconductor layer is formed over the oxide insulating layer.

15. The method for manufacturing a semiconductor device according to claim 13, further comprising:
    forming an oxide insulating layer over the second oxide semiconductor layer; and
    forming a gate electrode layer over the oxide insulating layer,
    wherein the interlayer insulating layer is provided over the gate electrode layer.

16. The method for manufacturing a semiconductor device according to claim 13,
    wherein the second oxide semiconductor layer is formed by sputtering method using a target having a composition ratio of In:Ga:Zn=1:x:y, and
    wherein x is greater than or equal to 0 and less than or equal to 2, and y is greater than or equal to 1 and less than or equal to 5.

17. The method for manufacturing a semiconductor device according to claim 16,
    wherein x is 1 and y is 1.

18. The method for manufacturing a semiconductor device according to claim 13,
    wherein a carrier concentration of the second oxide semiconductor layer is less than $1 \times 10^{12}$ cm$^{-3}$.

19. The method for manufacturing a semiconductor device according to claim 13,
    wherein the second heat treatment is performed at a temperature greater than or equal to 400° C. and less than or equal to 800° C.

20. The method for manufacturing a semiconductor device according to claim 13,
    wherein the first oxide semiconductor layer includes In—Zn—O, and
    wherein the second oxide semiconductor layer includes In—Ga—Zn—O.

21. The method for manufacturing a semiconductor device according to claim 13, further comprising:
    forming a gate electrode layer; and
    forming a source electrode layer and a drain electrode layer over the second oxide semiconductor layer,
    wherein the gate electrode layer overlaps with the source electrode layer and the drain electrode layer.

22. The method for manufacturing a semiconductor device according to claim 13, wherein the third heat treatment is performed so as to terminate dangling bonds with hydrogen, the dangling bonds existing at least in the first oxide semiconductor layer and the second oxide semiconductor layer.

* * * * *